United States Patent
Miyahira et al.

(10) Patent No.: US 6,502,064 B1
(45) Date of Patent: Dec. 31, 2002

(54) COMPRESSION METHOD, METHOD FOR COMPRESSING ENTRY WORD INDEX DATA FOR A DICTIONARY, AND MACHINE TRANSLATION SYSTEM

(75) Inventors: Tomohiro Miyahira, Yamato; Eiichi Tazoe, Tokyo-to, both of (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/144,148

(22) Filed: Aug. 31, 1998

(30) Foreign Application Priority Data

Oct. 22, 1997 (JP) ............................................. 9-289845

(51) Int. Cl.[7] ............................................. G06F 17/28
(52) U.S. Cl. ................................ 704/7; 704/10; 704/3; 707/532; 341/106
(58) Field of Search ............................... 704/2, 3, 4, 5, 704/6, 7, 8, 10; 707/531, 532, 533, 535, 536; 341/28, 22, 65, 95, 51, 106; 400/65, 67, 68; 345/171

(56) References Cited

U.S. PATENT DOCUMENTS

| | | | | |
|---|---|---|---|---|
| 4,843,389 A | * | 6/1989 | Lisle et al. | 341/106 |
| 4,959,785 A | * | 9/1990 | Yamamoto et al. | 707/533 |
| 5,006,849 A | * | 4/1991 | Baarman et al. | 341/95 |
| 5,333,313 A | * | 7/1994 | Heising | 707/1 |
| 5,337,233 A | * | 8/1994 | Hofert et al. | 707/540 |
| 5,389,922 A | * | 2/1995 | Seroussi et al. | 341/51 |
| 5,523,946 A | * | 6/1996 | Kaplan et al. | 704/2 |
| 5,787,386 A | * | 7/1998 | Kaplan et al. | 704/8 |
| 5,798,721 A | * | 8/1998 | Shibata | 341/106 |
| 5,889,481 A | * | 3/1999 | Okada | 341/51 |
| 5,951,623 A | * | 9/1999 | Reynar et al. | 708/203 |
| 6,047,298 A | * | 4/2000 | Morishita | 707/532 |
| 6,094,634 A | * | 7/2000 | Yahagi et al. | 704/260 |

FOREIGN PATENT DOCUMENTS

| | | | | |
|---|---|---|---|---|
| JP | 56-149667 | 11/1981 | | G06F/15/38 |
| JP | 63-292365 | 11/1988 | | G06F/15/20 |

* cited by examiner

Primary Examiner—Joseph Thomas
(74) Attorney, Agent, or Firm—Robert P. Tassinari

(57) ABSTRACT

A n-gram statistical analysis is employed to acquire frequently appearing character strings of n characters or more, and individual character strings having n characters or more are replaced by character translation codes of 1 byte each. The correlation between the original character strings having n characters and the character translation codes is registered in a character translation code table. Assume that a character string of three characters, i.e., a character string of three bytes, "sta," is registered as 1-byte code "e5" and that a character string of four characters, i.e., a character string of four bytes, "tion," is registered as 1-byte code "f1." Then, the word "station," which consists of a character string of seven characters, i.e., seven bytes, is represented by the 2-byte code "e5 f1," so that this contributes to a compression of five bytes.

12 Claims, 14 Drawing Sheets

COMPRESSION METHOD, METHOD FOR COMPRESSING ENTRY WORD INDEX DATA FOR A DICTIONARY, AND MACHINE TRANSLATION SYSTEM

DETAILED DESCRIPTION OF THE INVENTION

1. Field of the Invention

The present invention relates to a machine translation method for translating or converting original text in a first language (foreign language; e.g., English) to translated text in a second language (native language; e.g., Japanese), and in particular to a machine translation method whereby a computer system performs a translation process using an electronically stored dictionary. More specifically, the present invention pertains to a method for compressing entry word index data in a dictionary; to entry word indexes for a dictionary that have been compressed; and to a method for searching for a word based on an entry word index that has been compressed.

2. Background Art

Over the years, much time and effort has been expended in the study of so-called "machine translation" (or "automatic translation"), a technique involving the use of the hardware resources of a computer system to translate text in one language to text in a second language.

Not long after the end of the Second World War, for example, following the development in 1946 of ENIAC, the first general purpose computer, many researchers became greatly interested in the possibility of using computers for "machine translation." And over the next ten years universities and research institutes invested an enormous amount of time, energy and money in its study; but with generally unsatisfactory results.

Thereafter, interest in machine translation waned somewhat. But today, impelled by recent developments related to the use of the Internet, the focus is once again on machine translation; once again great interest is being shown in developing and producing software for this purpose. This has come about because many users of the Internet, outside the English speaking community of nations, either cannot read English or read it imperfectly, and since most text on Web pages are written in English, these users can not fully utilize the new global information system, the WWW (the World Wide Web). As a result, translation software that once, when first developed, was priced in the tens of millions of yen can now be purchased for tens of thousands of yen, and since such software is therefore more easily acquired by users, it is now widely used on personal computers. Of the machine translation software products that are presently available, some are specifically intended for the translation of text on the Internet, i.e., the translation of Web pages. One example of such a product is the "King of Translation," which is sold by IBM Japan Co., Ltd.

In short, machine translation is a technique by which the processing capability of a computer system is applied for the translation of text written in a foreign language, such as English, into text in a native language, such as Japanese (or vice versa). For machine translation, a database is constructed by employing, as a model, the enormous amount of language knowledge that a human possesses (or is assumed to possess), and a translation engine, a type of data processor, is employed to refer to this database and to perform the actual translation.

An example database for a machine translation system is a dictionary. Recent machine translation systems prepare a dedicated dictionary for each genre, such as an art dictionary and a sports dictionary, in addition to a system dictionary that serves as a basic dictionary. Machine translation systems use dictionaries in accordance with the genre to which an object to be translated belongs, and thus the accuracy of a translation can be improved (see the specification in Japanese Unexamined Patent Application Hei 8-272755. and corresponding U.S. Pat. No. 6,119,078 issued on Sep. 12, 2000. Generally, a single machine translation dictionary is constituted by an entry word index portion and a main portion that describes translation data for entry words (includes "morpheme analysis data). The translation engine searches through the entry word indexes to acquire corresponding translation data.

For distribution, a machine translation system, i.e., the machine translation software, is generally recorded on a storage medium, such as a CD (compact disk) or a FD (floppy disk). To activate the machine translation software, an end user inserts into a drive unit of his or her computer system a CD or FD he or she purchased and installs a program recorded thereon in the computer.

An entry word index portion of a machine translation system is generally not stored in text form; usually it is compressed or encoded before being stored. This is done because an index portion that has an easily readable form may be employed or examined by a third party, especially by a competitor, and because the size of compressed entry word index data is reduced and can thus be held resident in memory. This last is important because the entry word index data must be accessed each time a word search is conducted, and when the entry word index data is resident in memory, the speed of a search is greatly increased. In particular, the sizes of entry word indexes for a machine translation system that prepares some dictionaries must be reduced, so that all of them can be held resident in memory. Conventionally, a common compression algorithm, such as "LHA" for the general-purpose personal computer (PC) or a compression command "compress" for UNIX, is employed to compress entry word index data, or only an encoding process is performed for the index data without being compressed. However, these conventional techniques have the following shortcomings.

First, time is required for compression and recovery processing. In particular, once entry word index data are compressed, a search for data can not be performed, and thus, two steps are required: the decompression of the entry word index data and a search for the resultant data. As a result, the search efficiency is deteriorated.

In addition, since the individual entry words are short character strings (20 to 30 bytes at most), the compression rate is not good.

Further, only the simple encoding of data does not reduce data size.

It is, therefore, one object of the present invention to provide a method for compressing entry word index data for a dictionary to be used for machine translation, compressed entry word indexes for a dictionary, and a method for searching for a word using the compressed entry word index data.

It is another object of the present invention to provide a compression method that enables a search for compressed data to be performed without a decompression process being required, entry word indexes for a dictionary to be generated by such a compression method, and a method for searching for a word using the compressed entry word index.

SUMMARY OF THE INVENTION

To achieve the above objects, according to a first aspect of the present invention, a compression method comprises the steps of: (a) extracting character strings, constituted by n (n is an integer greater than 1) or more characters that frequently appear in an object to be compressed, which consists of many words; (b) calculating compression contribution values for the individual extracted character strings; (c) assigning highly ranked character strings having a high compression contribution value to empty columns in a character translation code table; and (d) substituting for a corresponding character translation code the character strings that are registered in the character translation code table.

According to the compression method in the first aspect of the present invention, the object to be compressed may be the entry word index data in a dictionary used for machine translation.

At step (b), for calculating the compression contribution value, the compression contribution value may be represented by (n−k)×count, which is a product of (n−k), a compression value obtained by replacing a character string S having n characters with a character string having k characters (n>k), and count, the frequency at which the character string S of the object to be compressed appears.

The character translation code table may be an ASCII (American Standard Code for Information Interchange) code table that conforms to the specifications prescribed by ANSI (American National Standards Institute).

According to a second aspect of the present invention, a method for compressing entry word index data for a dictionary used in a machine translation system, comprises the steps of: (a) extracting character strings constituted by n (n is an integer greater than 1) or more characters that frequently appear in the entry word index data; (b) calculating compression contribution values for the individual extracted character strings; (c) assigning highly ranked character strings having a high compression contribution value to empty columns in a character translation code table; and (d) substituting for a corresponding character translation code the character strings, in the entry word index data, that are registered in the character translation code table.

According to the compression method in the second aspect, at step (b), for calculating the compression contribution value, the compression contribution value may be represented by (n−k)×count, which is a product of (n−k), a compression value obtained by replacing a character string S having n characters with a character string having k characters (n>k), and count, the frequency at which the character string S in the entry word index data appears.

The character translation code table may be an ASCII (American Standard Code for Information Interchange) code table that conforms to the specification prescribed by ANSI (American National Standards Institute).

According to a third aspect of the present invention, a machine translation system for employing the processing capabilities of a computer system to translate text in a first language into text in a second language, comprises: a dictionary, including entry word index data compressed using the compression method according to the second aspect, and a main body in which are described translation data concerning entry words; and a translation engine for referring to the dictionary when translating text in the first language into text in the second language.

In the machine translation system according to the third aspect of the present invention, when the translation engine searches through the entry word index for a word included in text in the first language, the translation engine may, first, replace a character string included in a word registered in a character translation code table with a corresponding character translation code, and then perform search of the entry word index.

According to a fourth aspect of the present invention, provided is a computer-readable storage medium for physically storing a machine translation program that is operated by a computer system, which includes a processor for performing a software program, a memory for temporarily storing program code and data being progressed, an external storage device, input devices used by a user to enter data and a display for displaying processed data, the machine translation program comprising: (a) an entry word index data module compressed using the compression method according to the second aspect; (b) a dictionary main body module in which are described translation data concerning individual entry words; and (c) a translation engine module for referring to the dictionary constituted by the modules (a) and (b) to translate text in a first language into text in a second language.

In the computer-readable storage medium according to the fourth aspect of the present invention, when the translation engine module searches the entry word index for a word included in the text in the first language, the translation engine module may, first, replace a character string in the word, which is registered in a character translation code table, with a corresponding character translation code, and then perform search of the entry word index.

According to a fifth aspect of the present invention, a method for compressing entry word index data, for a dictionary used in a machine translation system, comprises the steps of: (a) translating original entry word index data into first entry word index data in which individual entry word character strings are represented by a difference from an entry word character string immediately above; (b) selecting, at step (a), an entry word I character string that has a large difference from an entry word character string immediately above, as a reference entry word character string to be described, unchanged, into the first entry word index data; (c) extracting character strings constituted by n (n is an integer greater than 1) or more characters that frequently appear in the first entry word index data; (d) calculating compression contribution values for the individual extracted character strings; (e) assigning highly ranked character strings having a high compression contribution value to empty columns in a character translation code table; and (f) replacing, with corresponding character translation codes, character strings in the first entry word index data that are registered in the character translation code table and generating second entry word index data.

According to the compression method in the fifth aspect, at step (d), for calculating the compression contribution value, the compression contribution value may be represented by (n−k)×count, which is a product of (n−k), a compression value obtained by replacing a character string s having n characters with a character string having k characters (n>k), and count, a frequency at which the character string S in the entry word index data appears.

The character translation code table may be an ASCII (American Standard Code for Information Interchange) code table that conforms to the specifications prescribed by ANSI (American National Standards Institute).

According to a sixth aspect of the present invention, a machine translation system, for employing the processing capability of a computer system to translate text in a first language into text in a second language, comprises: a dictionary including the second entry word index data compressed by the compression method according to the fifth aspect and a main body in which translation data concerning entry words are described; and a translation engine for referring to the dictionary to translate the text in the first language into the text in the second language.

In the machine translation system according to the sixth aspect of the present invention, when the translation engine conducts search of the entry word index for a word included in the text in the first language, the translation engine may, first, recover the original entry word character strings from character strings in the second entry word index data in accordance with the character translation code table, and compare the word with the recovered entry word character string.

According to a seventh aspect of the present invention, provided is a computer-readable storage medium for physically storing a machine translation program that is operated by a computer system, which includes a processor for performing a software program, a memory for temporarily storing program code and data being progressed, an external storage device, entry means used by a user to enter data and a display for displaying processed data, the machine translation program comprising: (a) a second entry word index data module compressed using the compression method according to the fifth aspect; (b) a dictionary main body module in which translation data concerning individual entry words are described; and (c) a translation engine module for referring to the dictionary constituted by the modules (a) and (b) to translate text in a first language into text in a second language.

In the computer-readable storage medium according to the seventh aspect of the present invention, when the translation engine module performs search of the entry word index for a word included in the text in the first language, the translation engine module may, first, recover the original entry word character strings from character strings in the second entry word index data in accordance with the character translation code table, and compare the word with the recovered entry word character string.

In the natural language processing field, the statistical characteristics of languages have been pointed out as the basic characteristics, and have been studied and researched. One of the statistical characteristics of language that has been focused on most is the frequency at which a character appears. Especially since a number of Indo-European languages have alphabets of only 26 characters, the use frequencies of the individual letters in the alphabets have been examined in detail.

To represent the feature of an English character string, not only the frequency at which a single character appears has been studied, but also the frequencies at which combinations of two or three characters appear have been examined. These combinations are called 2-gram or 3-gram, but generally "In-gram strings." The order of the frequencies is affected by the type of text used to derive the statistics. In 2-gram statistics, character strings th, he, in, an, er, re and on frequently appear; in 3-gram statistics, character strings that seem to be part of a spelling of a word are extracted; and in n-gram statistics, character strings that appear frequently and conform to the English characteristics are extracted.

The compression method of the present invention employs the statistical characteristics of language. More specifically, the n-gram statistical analysis is employed to acquire frequently appearing character strings of n characters or more, and individual character strings having n characters or more are replaced by character strings having fewer than n characters, (e.g., character translation codes of 1 byte each). The correlation between the original character strings having n characters and the character translation codes is registered in the correlation table i.e., a character translation code table.

Assume that a character string of three characters, i.e., a character string of three bytes, "sta," is registered as 1-byte code "e5" and that a character string of four characters, i.e., a character string of four bytes, "tion," is registered as 1-byte code "f1." Then, the word "station," which consists of a character string of seven characters, i.e., seven bytes, is represented by the 2-byte code "e5 f1," so that this contributes to a compression of five bytes. When a character string "e5 f1" is found in compressed text data, columns for "e5" and "f1" in the code table prepared in advance are referred to, and the character string can be easily translated to the original character string "station." That is, the original word can be searched for without decompressing the compressed text.

According to the first aspect of the present invention, character strings constituted by n (n is an integer greater than 1) or more characters are extracted that frequently appear in an object to be compressed that consists of many words, and a compression contribution value is calculated for the individual extracted character strings. The compression contribution value is represented by (n−k)×count, which is a product of (n−k), the compression value obtained by replacing a character string S having n bytes with a character string having k bytes, and count, a frequency at which the character string S of the object to be compressed appears.

Then, highly ranked character strings having a higher compression contribution value are assigned to empty columns in a predetermined character translation code table. Assuming that as a result of the n-gram statistics, the compression contribution values of character strings "sta" and "tion" are high and that the columns "e5" and "f1" in the table are unused, the character strings "sta" and "tion" are registered in the respective columns.

The character strings to be compressed that are registered in the character translation code table are replaced by the corresponding character translation codes. For example, a character string "station" of seven characters is compressed to a character code of "e5 f1" in accordance with the character translation code table.

The compression method according to the second aspect of the present invention is the one where the compression method of the first aspect is applied for the compression of entry word index data in a dictionary used for machine translation. According to the second aspect, first, character strings constituted by n (n is an integer greater than 1) or more characters that frequently appear are extracted from the entry word index data, and a compression contribution value is calculated for the individual extracted character strings. The compression contribution value is represented by (n−k)×count, which is a product of (n−k), a compression value obtained by replacing a character string S having n bytes with a character string having k bytes, and count, the frequency at which the character string S of the object to be compressed appears.

Then, highly ranked character strings having a higher compression contribution value are assigned to empty columns in a predetermined character translation code table. The character translation code table may be an ASCII (American Standard Code for Information Interchange) code table that conforms to the specifications prescribed by ANSI (American National Standards Institute). An ASCII code table is well known in this field as a table where alphanumeric characters are assigned for code. Assuming that as a result of the n-gram statistics, the compression contribution values of character strings "sta" and "tion" are high, the character strings "sta" and "tion" are assigned to the respective empty columns "e5" and "f1" in the ASCII code table.

The character strings in the entry word index data that are registered in the character translation code table are replaced with corresponding character translation codes. For example, an entry word "station" in the entry word index data is compressed to a character code of "e5 f1" in accordance with a modified ASCII code table that is newly generated. In this case, a word "station," which consists of a character string of seven characters, i.e., seven bytes, is represented by the 2-byte code "e5 f1," so that this contributes to a compression of five bytes. This compression process is performed for all the entry word index data. It should be noted that as a result, a great amount of entry word index data can be compressed. Thus the compressed entry word index data can remain resident in a main memory having a limited storage capacity without being withdrawn (swapped out).

The third aspect of the present invention is a machine translation system that employs entry word index data compressed in the second aspect. The machine translation system, for employing the processing capability of a computer system to translate text in a first language into text in a second language, comprises: a dictionary including entry word index data compressed by the compression method according to the second aspect and a main body in which translation data concerning entry words are described; and a translation engine for referring to the dictionary to translate the text in the first language into the text in the second language.

In the machine translation system according to the third aspect of the present invention, when the translation engine conducts search of the entry word index data for a word included in the text in the first language, the translation engine, first, replaces a character strings in the word, which are registered in a character translation code table (the modified ASCII code table generated by the compression method in the second aspect) with corresponding character translation code, and conducts search of the entry word index. When, for example, a word "station" is found in an English document, which is the text in the first language, the word is translated into character codes "e5 f1" in accordance with the ASCII code table (assuming that the character codes "e5" and "f1" are assigned to "sta" and "tion"). Then, search is conducted of the entry word index data for the character code "e5 f1," and translation data corresponding to the original character string "station" are acquired.

In the compressed entry word index data, the character string "station" of seven characters, i.e., seven bytes, is compressed into the 2-byte code "e5 f1." To search for the word "station" in the entry word index data, the word need only be translated into the corresponding character code "e5 f1," and the entry word index data do not have to be decompressed. That is, since to examine the index data the decompression process of the compressed entry word index data is not required, a reduction in the search speed does not occur.

The compression method of the fifth aspect is an example where the compression method of the first aspect, as well as the second aspect, is employed for the compression of entry word index data in a dictionary used for machine translation.

The compression method in the fifth aspect differs from the method in the second aspect in that, before entry word index data are compressed according the n-gram statistics, the differences between closely related entry word character strings is obtained to further increase the compression rate.

According to the compression method of the fifth aspect, first, original entry word index data are translated into first entry word index data in which individual entry word character strings are represented by a difference from an entry word character string immediately above. A character string for which a large difference exists with an immediately preceding entry word character string is maintained, unchanged, as the reference entry word character string in the first entry word index. When "abatable," "abate" and "abatement" are arranged in ascending order in the original entry word index, entry word "abate" is substituted into character count 4, which is a count matching the immediately preceding entry word "abatable," and "e," which is a difference with the word "abatable." An entry word "abatement" is substituted into character count 5, which is a count matching the immediately preceding entry word "abate," and "ment," which is a difference with the word "abate." These replacements are written into the first entry word index. Further, when the matching character count of the entry word "abatable" is extremely low relative to the immediately preceding entry word, that entry word is defined as the reference character string, so that the original entry word character string remains unchanged in the first entry word index and the matching character count is reset to 0.

Following this, the n-gram statistics is conducted for the character string difference in the first entry word index. The character strings constituted by n (n is an integer greater than 1) or more characters that frequently appear are extracted, and a compression contribution value is calculated for the individual extracted character strings. The compression contribution value is represented by (n−k)×count, which is a product of (n−k), a compression value obtained by replacing a character string S having n bytes with a character string having k bytes, and count, a frequency at which the character string S in the entry word index data appears.

Then, highly ranked character strings having a higher compression contribution value are assigned to empty columns in a predetermined character translation code table. The character translation code table may be an ASCII (American Standard Code for Information Interchange) code table that conforms to the specifications prescribed by ANSI (American National Standards Institute). An ASCII code table is well known in this field as a table in which alphanumeric characters are assigned to code. Assuming that as a result of the n-gram statistical analysis the compression contribution values of character strings "able" and "lity" are high, the character strings "able" and "lity" are assigned to the respective empty columns "03" and "ad" in the ASCII code table.

The character strings in the first entry word index data that are registered in the character translation code table are replaced by corresponding character translation codes. For example, an entry word in the first entry word index, "06 (matching character count) ion (character string difference)" (original entry word is "abjection"), is compressed to a character code of 1106 99" in accordance with the newly generated ASCII code table. In this case, a word "abjection," which consists of a character string of nine characters, i.e., nine bytes, is represented by the 2-byte code "06 99," so that this contributes to a compression of seven bytes. This compression process is performed for all the entry word index data. Thus, the entry word index that has been substituted into the corresponding character translation code is the second entry word index, which is used for searching for a word in the dictionary during the machine translation processing.

According to the fifth aspect of the present invention, as is described above, an n-gram statistical analysis is conducted for a difference between the entry word character strings, and their compression contribution values are compared. As a result of the acquisition of the difference, the character string at the end portion of each entry word can be effectively extracted. For example, suffixes, such as "ion," "ness" and "ly," which are inherent to the English language and appear frequently, are extracted as character string differences. Therefore, compared with the compression method of the second aspect whereby an n-gram statistical analysis is conducted only for entry words, a long character string may be set in the high compression contribution ranks, and the compression rate can be further increased. The thus compressed entry word index data can be held resident in a main memory having a limited storage capacity without being withdrawn (swapped out). Especially for machine translation software program that prepares some dictionaries, compression of data and reduction in data size are effective means for holding the entry word index data resident in memory.

The sixth aspect of the present invention is a machine translation system that employs the entry word index data compressed in the fifth aspect. The machine translation system, for employing the processing capability of a computer system to translate text in a first language into text in a second language, comprises: a dictionary that includes the second entry word index data compressed by the compression method according to the fifth aspect, and a main body in which translation data concerning entry words are described; and a translation engine for referring to the dictionary to translate the text in the first language into the text in the second language.

In the machine translation system according to the sixth aspect of the present invention, when the translation engine performs search of the entry word index for a word included in the text in the first language, first, the translation engine recovers the original entry word character strings from character strings in the second entry word index data in accordance with the character translation code table, and then compares the word with the recovered entry word character string.

In the second entry word index, the reference entry word character string is maintained as the original entry word character string. Therefore, first, the reference character string that is most similar to a word is searched for in the second entry word index. When, for example, a word "abjection" is found in an English document, which is the text in the first language, a reference character string "abidance" in the second entry word index is extracted as a candidate character string. If the word being searched for completely matches the candidate character string, the search of the dictionary is terminated. If the word does not match the candidate character string, an entry word that immediately succeeds the candidate character string is examined. If the immediately succeeding entry word is compressed, the original entry word character string must be recovered. If "04 (matching character count) 65 (character string difference code)" is an entry word that succeeds the reference entry word "abidance," which is first extracted as a candidate character string, the first four characters "abid" are extracted form the immediately preceding entry word character string "abidance," and a character "ell >a assigned to column "65" in the ASCII code table. The character strings "abid" and "e" are coupled to recover the original character string "abide." When the candidate character string that is recovered matches the word being searched for, the dictionary search is terminated. If they do not match, the recovering and comparison process is repeated for a succeeding entry word in the index. As a result of repetition, the word "abjection" is obtained from the entry word index, and corresponding translation data can be acquired.

In the second entry word index data, the character string "abjection" of nine characters, i.e., nine bytes, is compressed into the 2-byte code "06 99," which is held. The entire entry word index data do not have to be decompressed in order to search for the word "abjection" from the entry word index data. That is, since the decompression process for the compressed entry word index data is not required for an examination of the index data, a reduction in the search speed does not occur.

According to a computer-readable storage medium of the fourth or the seventh aspect of the present invention, the structural or functional cooperative relationship between a computer program and a storage medium is defined in order to implement the function of a computer program in a computer system. That is, when the computer storage medium is loaded into a computer system (or a computer program is installed in a computer system), the cooperative operation can be demonstrated by the computer system. As a result, the same operating effect as in the machine translation system according to the third or the sixth aspect of the present invention can be obtained.

BRIEF DESCRIPTION OF THE DRAWINGS

Other objects, features and advantages of the present invention will become apparent during the course of the following detailed description of the preferred embodiment, given while referring to the accompanying drawings of which.

PREFERRED EMBODIMENT

The preferred embodiment of the present invention will now be described in detail while referring to the accompanying drawings.

A. Hardware environment for implementing machine translation

Entry word index data compressed by a compression method according to the present invention are employed by a dedicated machine translation processing apparatus, or by a general purpose personal computer for the execution of a machine translation program.

Figure 1:
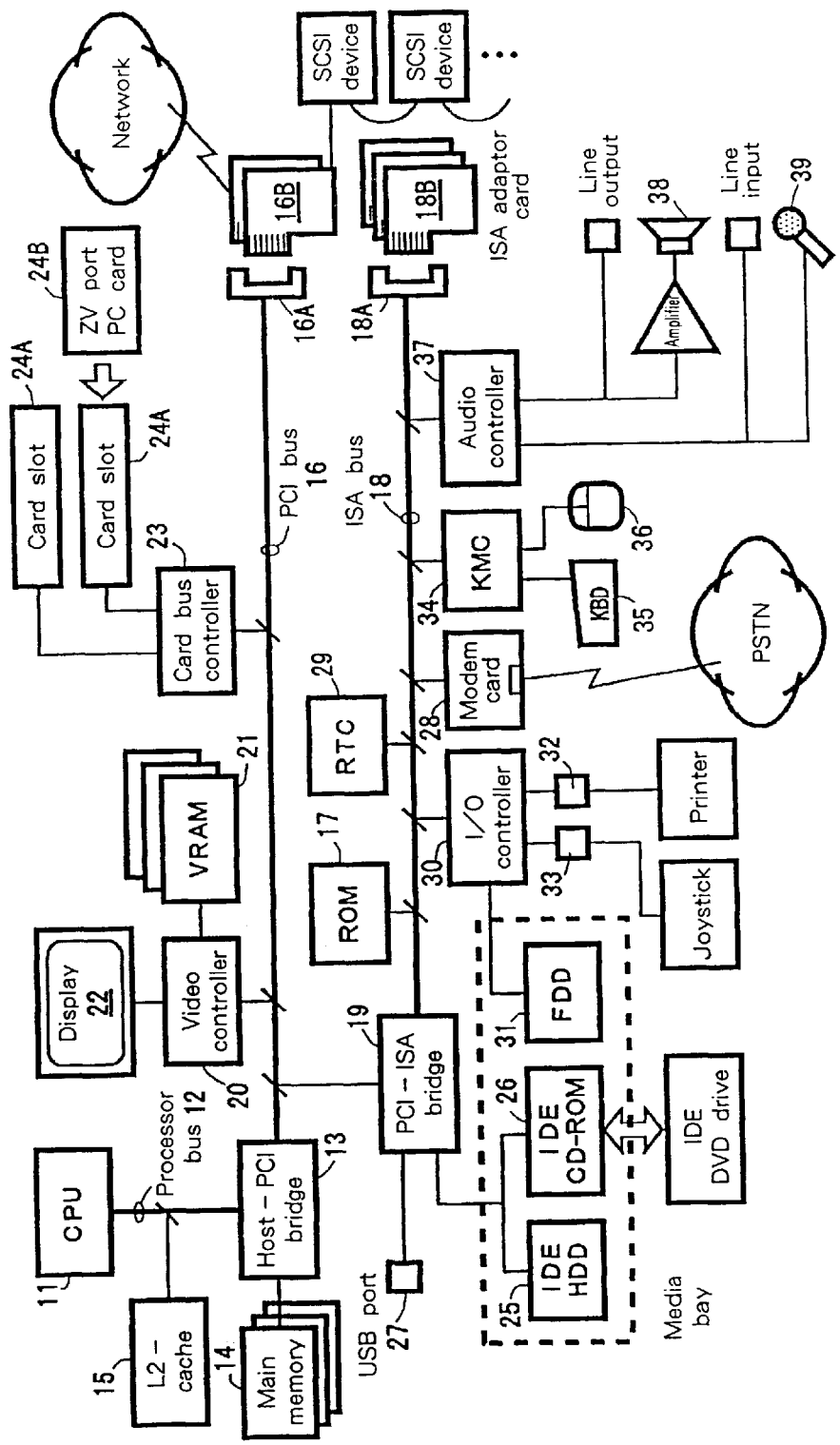
FIG. 1 is a schematic diagram illustrating the hardware arrangement of a typical personal computer (PC) appropriate for implementing the present invention.

FIG. 1 is a schematic diagram illustrating the hardware arrangement of a typical personal computer (PC) 100 according to the present invention. The PC 100 conforms to the OADG (PC open Architecture Developer's Group) specifications, and either "Windows 95" ? of Microsoft Corp. or "Os/2" of IBM Corp. is mounted as an operating system (Os). The individual sections will now be described.

A CPU 11, a main controller, executes various programs under the control of the OS. The CPU 11 is, for example, a CPU "Pentium" chip or an "MMX technology Pentium" chip, each of which is produced by Intel Corp.

The CPU 11 is connected to hardware components, which will be described later, through a processor bus 12, which is connected to its external pins; a PCI (Peripheral Component Interconnect) bus 16, which acts as a local bus; and an ISA bus (Industry Standard Architecture) bus 18, which acts as a system bus.

The processor bus 12 and the PCI bus 16 communicate with each other across a bridge circuit (a host-PCI bridge) 13. The bridge circuit 13 in this embodiment includes a memory controller for controlling an operation for accessing a main memory 14, and a data buffer for absorbing a data transfer speed difference between the buses 12 and 16.

The main memory 14 is volatile memory and is used as a writing area for an executing program, or as a work area for the program. Generally, the main memory 14 consists of a plurality of DRAM (Dynamic RAM) chips. A memory capacity of, for example, 32 MB is provided as a standard and can be expanded to 256 MB. The programs to be executed include device drivers that access an OS, such as Windows 95 or peripheral devices, and various application programs, such as a machine translation program.

An L2-cache 15 is high-speed memory for absorbing the time required by the CPU 11 to access the main memory 14. A very limited amount of code and data that the CPU 11 frequently accesses are temporarily stored in the L2-cache 15. Generally, the L2-cache 15 consists of SRAM (static RAM) chips, and its memory capacity is, for example, 512 KB.

The PCI bus 16 is a bus for a relatively fast data transfer (a bus width of 32/64 bits, a maximum operating frequency of 33/66 MHz and a maximum data transfer speed of 132/264 MBps). PCI devices, such as a video controller 20 and a card bus controller 23, that are operated at relatively high speeds are connected to the PCI bus 16. The PCI architecture was originated and advocated by Intel Corp., and implements a so-called PnP (Plug-and-Play) function.

The video controller 20 is a dedicated controller for the actual processing of graphics commands received from the CPU 11. The processed graphics information is temporarily written in a screen buffer (VRAM) 21, and is then read from the VRAM 21 and output as graphics data to an LCD (liquid crystal display) or a CRT (Cathode Ray Tube) display 22.

The card bus controller 23 is a dedicated controller for directly transmitting a bus signal on the PCI bus 16 to the interface connector (card bus) of a PC card slot 24A. A PC card 24B, which conforms to the specifications (e.g., "PC Card Standard 95") established by the PCMCIA (Personal Computer Memory Card International Association)/JEIDA (Japan Electronic Industry Development Association), can be inserted into the card slot 24A. An example PC card 24B is a LAN card for network connection, an HDD incorporated card employed as an external storage device, or a SCSI (Small Computer System Interface) card for external connection to a SCSI device.

The PCI bus 16 and the ISA bus 18 are mutually connected by a bridge circuit (PCI-ISA bridge) 19. The bridge circuit 19 in this embodiment includes a DMA controller, a programmable interrupt controller (PIC) and a programmable interval timer (PIT). The DMA controller is a dedicated controller for performing a data transfer between a peripheral device (e.g., an FDD) and the main memory 14 that does not pass through the CPU 11. The PIC is a dedicated controller for executing a specific program (an interrupt handler) in response to interrupt requests (IRQ) from individual peripheral devices. The PIT is a device for generating a timer signal at a predetermined cycle. The cycle for the timer signal generated by the PIT is programmable.

The bridge circuit 19 in this embodiment also includes an IDE (Integrated Drive Electronics) interface for connecting external storage devices that conform to the IDE specifications. An IDE hard disk drive (HDD) 25 is connected to the IDE interface, and an IDE CD-ROM drive 26 is also installed by using an ATAPI (AT Attachment Packet Interface) connection. Another type of IDE device, such as a DVD (Digital video Disc or Digital Versatile Disc) drive, may be installed instead of the IDE CD-ROM drive. These external storage devices are exchangeably stored in a storage space called a "media bay" or a "device bay" in the system 100.

The data transfer speed of the HDD 25 is superior to that of other external storage devices. A software program (an OS or an application) copied to the HDD 25 is in the standby state for use by the system 100 (i.e., installation is completed). The CD-ROM drive 26 and a DVD drive handle storage mediums, such as a CD and a DVD. A computer program to be installed in the system 100, for example, can supplied on a CD or a DVD.

The bridge circuit 19 in this embodiment has a USB route controller for connecting a USB (Universal Serial Bus), a general purpose bus, and a USB port 27. The USB supports a hot plugging function for the insertion and removal of an additional peripheral device (a USB device) while the system 100 is powered on, and a plug-and-play function for automatically identifying a newly connected peripheral device and for re-configuring a system configuration. A maximum 63 USB devices can be connected to a single USB port in a daisy chain manner. An example USB device is a keyboard, a mouse, a display motor or a printer (not shown).

The ISA bus 18 is a bus that has a lower data transfer speed (a bus width of 16 bits and a maximum data transfer speed of 4 MBps) than has the PCI bus 16. The ISA bus 18 is used for the connection of peripheral devices, such as a ROM 17, a modem card 28, a real time clock (RTC) 29, an I/O controller 30, a keyboard/mouse controller (KMC) 34 and an audio controller 37, that are driven at a relatively low speed.

The ROM 17 is nonvolatile memory for the permanent storage of a code group (BIOS: Basic Input/Output System) for the input and output signals for the hardware components, such as a keyboard 35 and a floppy disk drive (FDD) 31, and a test program (POST: Power On Self Test) that is run when the system 100 is first powered on.

The modem card 28 is a device for transmitting digital computer data across an analog public switched telephone network (PSTN). The modem card 28 includes circuit components, such as a signal processor (a modem chip), for modulating data to be transmitted and demodulating received data, and a data access arrangement circuit (DAA) for connecting a modem to a public switched telephone network in accordance with the line switch standards of individual countries.

The real time clock (RTC) 29 is a device for measuring the current time. Generally, the RTC 29 and a CMOS memory (not shown) are mounted together on a single chip. The CMOS memory is used to store information, such as system configuration information (a BIOS setup value) and a power ON password, that is required for the security/safety of the system 100. The RTC/CMOS 29 is backed up by a reserve battery (ordinarily a coin battery: not shown) so that the contents obtained by measurement and the stored data are not lost when the system 100 is powered off.

The I/O controller 30 is a peripheral controller for driving the floppy disk drive (FDD) 31, and for controlling the input/output of parallel data (PIO) through a parallel port 32 and the input/output of serial data (SIO) through a serial port 33. A printer, for example, is connected to the parallel port 32 and a joystick is connected to the serial port 33.

The keyboard/mouse controller (KMC) 34 is a peripheral controller for fetching as scan code data input at the keyboard 35, or as coordinate locations designated by the pointing device 36.

The audio controller 37 is a dedicated controller for processing the input/output of an audio signal, and includes a CODEC circuit (Coder-DEcoder, an A/D and D/A converter having a mixing function) for digital recording and the playing of audio signals. An audio signal that is received originates as input at a microphone 39, or as line input data originating at an external audio device (not shown). A generated audio signal is amplified by an audio amplifier and the resultant signal is released at a loudspeaker 38, or an audio signal is output to a line to an external audio device (not shown). one or more PCI bus slots 16A or ISA bus slots 18A are provided at one end of the bus 16 or the bus 18. PCI adaptor cards 16B and ISA adaptor cards 18B respectively can be plugged into the bus slots 16A and 18A. An example adaptor card is a LAN card for the connection of the PC 100 to a network. Another example is the SCSI card for the external connection of the PC 100 to a SCSI device, such as an HDD, a CD-ROM drive or a printer.

A typical user of the personal computer 100 can operate the system by using the keyboard 35 or the mouse 36 to execute various application programs, such as word processing, spreadsheet and communication programs, and to provide assistance in the performance of a job while he or she is viewing a display screen. For example, a user can install, in the computer system 100, a machine translation program recorded on a CD or an FD by copying it from the CD-ROM drive 26 or the FDD 31 to the HDD 25. Or, a desired software program can be installed in the computer system 100 by transferring a file from a remote server (Web server) to the HDD 25 through a network. A computer system 100 in which a machine translation program is installed and is executing serves as a machine translation system.

So-called personal computers that are currently available on the market fully satisfy the hardware conditions that will enable them to serve as a computer system 100 such as is shown in FIG. 1. Although many electric circuits other than those shown in FIG. 1 are required to construct the computer system 100, they are well known to one having ordinary skill in the art. And as they are not directly related to the subject of the present invention, no explanation for them will be given. Further, it should be noted that, to avoid making the drawings too complex, only one part of the connections between the hardware blocks in FIG. 1 is shown.

B. Machine translation system

A machine translation system incorporating dedicated hardware for machine translation, or a general purpose personal computer for executing a machine translation program, one of the conceptual system structures shown in FIG. 2.

Figure 2A:
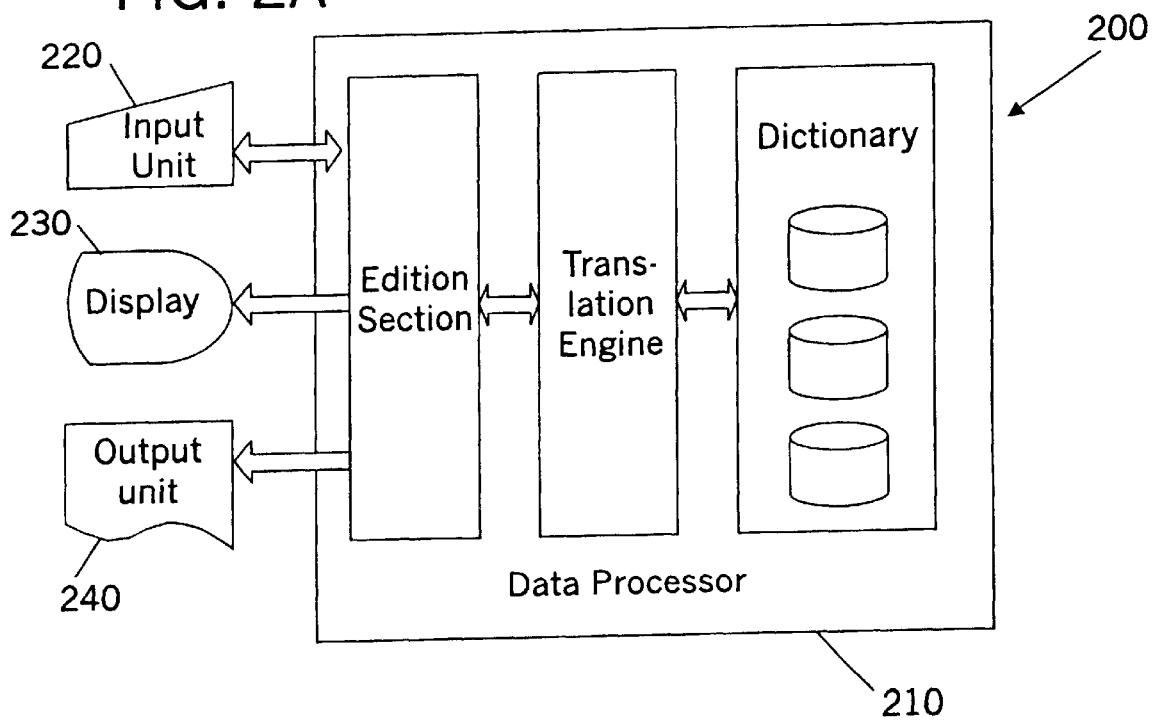
FIGS. 2(a) and 2(b) are conceptual diagrams showing machine translation systems

In FIG. 2(a) is schematically shown a general machine translation system 200. The system 200 comprises a data processor 210, an input unit 220, a display unit 230 and an output unit 240. The data processor 210 includes components, such as a CPU 11 and a memory 14, mounted on a motherboard. The display unit 230 is equivalent to a display 22. The input unit 220 includes a keyboard 35 and a mouse 36. The output unit 240 includes a printer for printing the obtained processing results, and external storage devices, such as an HDD 25 and an FDD 31 for storing data.

The data processor 210 includes an editing section, a translation engine and a dictionary. The editing section reads text to be translated from an external storage device, such as the HDD 25, or provides, with the input unit 220, an environment for the editing of text on the display unit 230.

The translation engine, the core of the system 200, refers to the dictionary to translate original text in the first language (English), which is supplied by the editing section, to translated text in the second language (Japanese).

The dictionary generally consists of entry word index data and storage space where translation data are stored for individual entry words. The translation engine performs search of the entry word index to acquire the translation data. A currently available machine translation system 200 tends to prepare a dedicated dictionary for each genre, such as an art dictionary or a sports dictionary, in addition to the basic system dictionary.

Figure 2B:
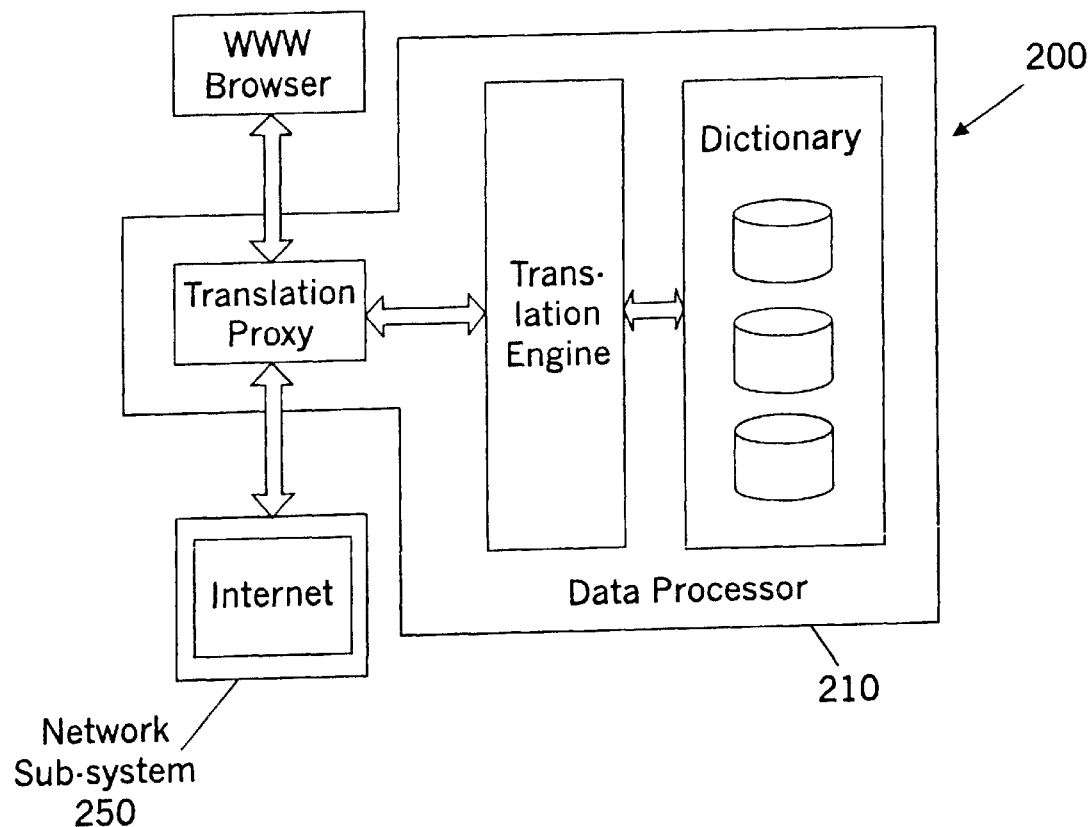

In FIG. 2(b) is schematically shown a special machine translation system 200 for the translation of text on the Internet, i.e., the translation of Web pages. The system 200 comprises a data processor 210 and a network sub-system 250.

The network sub-system 250 includes a device for connecting the computer system 100 to the Internet; specifically, a device such as a modem card 28 for effecting a connection across a public switched telephone network, or a LAN adaptor card 16B for effecting a connection with a LAN. If the modem card 28 is employed, a dial-up IP connection to the Internet is established by a service provider, and if the LAN adaptor card 16B is employed, a gateway connection to the Internet across a router can be established.

The data processor 210 is physically constituted by components mounted on a motherboard, including the CPU 11 and the memory 14, and theoretically is constituted by cooperative operation with a translation proxy, a translation engine and a WWW browser.

The WWW browser is a computer program that serves as a so-called "Internet tour guide," and is, for example, the "Netscape Navigator" program from of Netscape Corp. The WWW browser provides a user interface for input or for making a site connection using a URL (Universal Resource Locator), and can also acquire a file (normally an HTML (HyperText Markup Language) file) from a WWW server designated by the URL, interpret the contents of the file and display the results on the display 22.

The machine translation system in this embodiment has a proxy function, and upon the receipt of a request from the WWW browser, performs a file download process, while being interposed with the WWW server inbetween. The translation proxy transmits the text portion in a downloaded HTML file to the translation engine to charge it with the translation work. The translation engine refers to the dictionary and translates the received original text in the first language (English) into translated text in the second language (Japanese). When the WWW browser receives the translation results from the translation proxy, it displays the results on the display 22 along with an image file (a GIF file or a JPEG file) described in the HTML file.

The dictionary generally consists of entry word index data and storage space where translation data are stored for individual entry words. The translation engine performs search of the entry word index to acquire the translation data. A currently available machine translation system 200 tends to prepare a dedicated dictionary for each genre, such as an art dictionary or a sports dictionary, in addition to the basic system dictionary.

C. Processing for the compression of entry word index data in a dictionary

The processing for the compression of entry word index data will now be described in detail.

Table 1 shown an example entry word index. This is an extract of one part of an upper portion of an entry word index for a system dictionary that is included in the "King of Translation" sold by IBM Japan, Co., Ltd. In the following explanation, it is assumed that one character is represented by one byte. Table 1 a-bomb
a-cappella
a-deux
a-fond
a-fortiori
a-la-carte
a-la-king
a-la-mode
a-level
a-number
a-posteriori
a-priori
a-tempo
a.c.
a.m.
a.w.O.l.
a/c
aardvark
ab-initio
ab.
abaci
aback
abacus
abaft
abalone
abandon
abandoned . . .

Then compressed entry word index data are loaded into the memory 14 of the computer 100, which functions as the translation system, or is resident in the memory 14. Each time the system 100 activates the machine translation program, the compression process for the entry word index data may be performed, and the compressed entry word index data may be loaded into the memory 14. However, taking into consideration the use of the same compressed entry word index data, a maker for a machine translation program may compress entry word index data in advance, and may store the compressed entry word index data, in addition to the machine translation program, on a storage medium, such as a compact disk, which is then sold or distributed. Also in such a case, the compression process can be performed in a hardware environment (see FIG. 1) equivalent to the general purpose computer system 100 employed by a user that operates a machine translation program.

C-1. First embodiment

Figure 3:
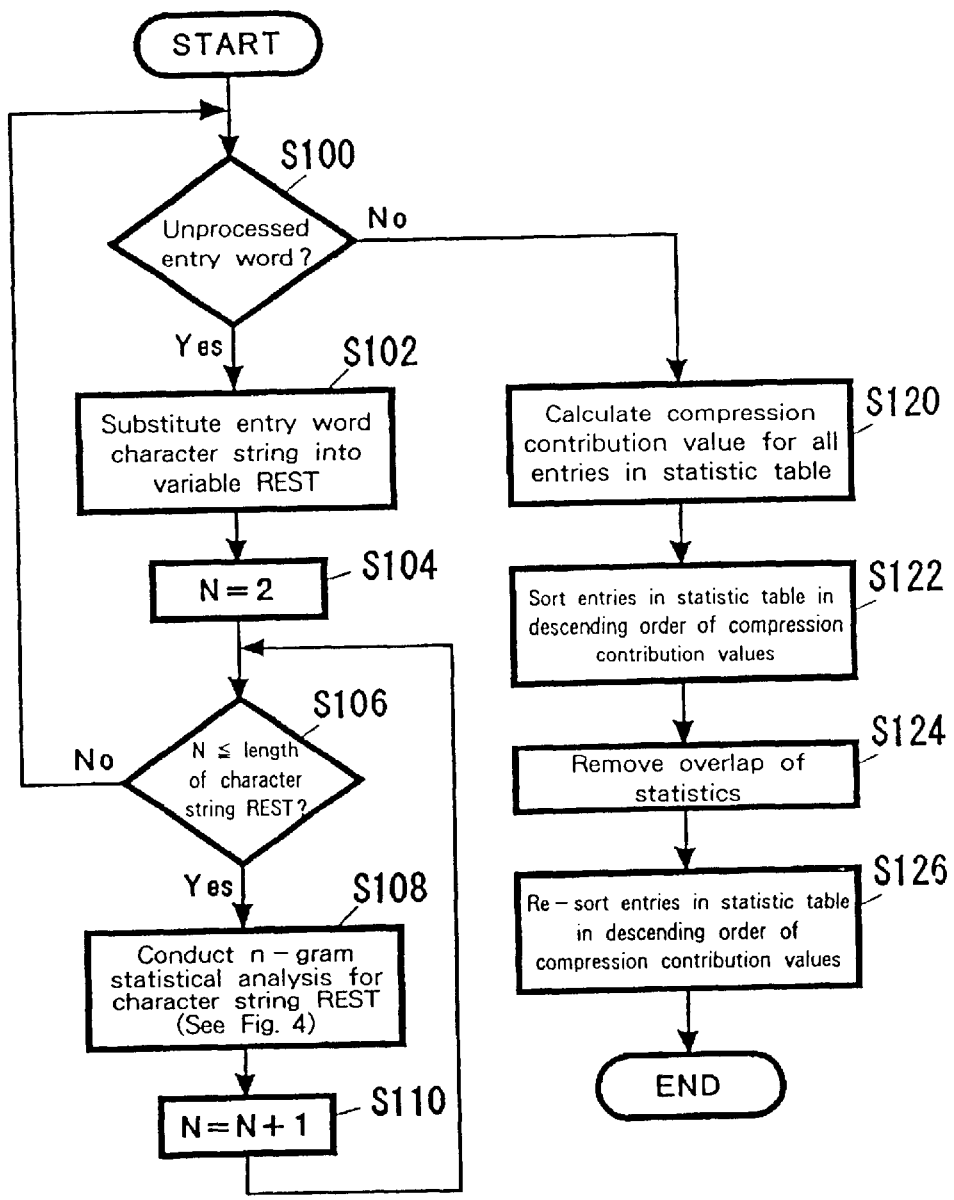
FIG. 3 is a flowchart showing the processing for calculating compression contribution values for individual entry words (first embodiment).

First, a first embodiment for compressing entry word index data will be described while referring to FIGS. 3 to 6.

n-gram statistical analysis process:

FIG. 3 is a flowchart showing the processing for calculating a compression contribution value for each entry word. The processing is positioned as a pre-process for the entry word index data compression processing.

The compression contribution value represents the compression effect imposed on the entry word index data when a character string of n characters (i.e., n bytes) or more is replaced by a character string of less than n characters (one byte in this case). It would be easily understood that the compression contribution value is large when a character string that frequently appears in an entry word index, or a character string that consists of many characters (many bytes), is replaced by a single character (i.e., a one-byte code). The frequencies at which character strings having n characters (n=2, 3, . . . ) appear in the entry word index are calculated using the so-called n-gram statistical analysis. The compression contribution value when a character string having n characters, i.e., n bytes, is substituted with one byte code is acquired by multiplying the count at which the character string appears in the entry word index, and a byte difference (n−1). The individual steps in the flowchart in FIG. 3 will now be described in detail.

A first IF loop constituted by a conditional sentence (step S100), "Is there an unused entry word?" is used to examine the n-gram statistics for the entire entry word index.

In the first IF loop, initially, the first remaining entry word is read from the original entry word index, and is substituted into variable REST (step S102). Then, value 2 is substituted into N (step S104), and the processing is initiated for the 2-gram statistical analysis.

In the second IF loop constituted by a conditional sentence (step S106), "Is N equal to or smaller than the length of the REST character string?," the n-gram statistical analysis process is performed for the character string REST (step S108, described in detail later). When the n-gram statistical analysis process for N=2, i.e., the 2-gram statistical analysis process has been completed, N is incremented by one (step S110), and the same IF loop processing (i.e., the (N+1)-gram statistical analysis process) is repeated.

When N exceeds the length of the character string REST, it is assumed that the n-gram statistical analysis process for the character string REST has been terminated, and at branch "No" of the decision block S106, program control exits the second IF loop and returns to step S100.

At step S100, the acquisition of the next entry word in the entry word index is attempted. If the n-gram statistical analysis process is terminated for all the entry words in the entry word index, program control exists the first IF loop at branch "No" of decision block S100. The termination of the first IF loop represents the completion of the collection of the n-gram statistic data. At this time, a tentative n-gram statistic table is generated.

Table 2 shows an example tentative n-gram statistic table. This reflects the results obtained by the statistical analysis process when the first IF loop is terminated in FIG. 3 for the entry word index data in a system dictionary that is included in the machine translation software the "King of Translation" sold by IBM Japan Co., Ltd. The individual entries in the statistic table include extracted character strings having n characters, i.e., n bytes, and fields in which are stored the frequencies at which these character strings appear in the entry word index. For example, the 25th entry in Table 2 indicates that character string "ess" appears in the entry word index at 4321 times.

TABLE 2

| Entry No. | Chara. strg. | Frequency count | Compress value | Entry No. | Chara. strg. | Frequency count | Compress value | Entry No. | Chara. strg. | Frequency count | Compress value |
|---|---|---|---|---|---|---|---|---|---|---|---|
| #001 | er | 10945 | 5021 | #071 | mi | 2382 | 1605 | #141 | cr | 1315 | 1054 |
| #002 | in | 9664 | 4960 | #072 | th | 2350 | 1551 | #142 | gr | 1306 | 1050 |
| #003 | ti | 8081 | 4147 | #073 | ia | 2346 | 1545 | #143 | ke | 1302 | 1048 |
| #004 | on | 7439 | 3987 | #074 | ur | 2287 | 3072 | #144 | og | 1300 | 1045 |
| #005 | at | 6865 | 3772 | #075 | nc | 2282 | 1524 | #145 | ry | 1286 | 2088 |
| #006 | es | 6742 | 3645 | #076 | as | 2271 | 1523 | #146 | bo | 1284 | 2062 |
| #007 | re | 6717 | 3562 | #077 | sh | 2250 | 1503 | #147 | vi | 1272 | 1017 |
| #008 | en | 6116 | 3363 | #078 | ent | 2235 | 3002 | #148 | sp | 1266 | 1012 |
| #009 | te | 6537 | 3343 | #079 | ter | 2223 | 1500 | #149 | tu | 1254 | 2008 |
| #010 | an | 6458 | 3326 | #080 | pr | 2143 | 1498 | #150 | ag | 1250 | 1003 |
| #011 | ne | 6424 | 3323 | #081 | ec | 2132 | 1490 | #151 | ph | 1221 | 1002 |
| #012 | le | 6379 | 3256 | #082 | ha | 2127 | 1489 | #152 | ene | 1184 | 1982 |
| #013 | al | 6255 | 9315 | #083 | om | 2088 | 1465 | #153 | ity | 1181 | 988 |
| #014 | ly | 5579 | 3059 | #884 | ho | 2030 | 1463 | #154 | um | 1179 | 976 |
| #015 | st | 5536 | 6002 | #085 | ul | 2016 | 1449 | #155 | ally | 1178 | 971 |
| #016 | ss | 5440 | 2934 | #086 | iv | 1971 | 1435 | #156 | oc | 1156 | 1932 |
| #017 | ra | 5384 | 2797 | #087 | hi | 1942 | 1427 | #157 | lcal | 1156 | 956 |
| #018 | is | 5123 | 2792 | #088 | ble | 1928 | 4209 | #158 | do | 1129 | 956 |
| #019 | ar | 5021 | 2775 | #089 | ge | 1898 | 1402 | #159 | ep | 1127 | 952 |
| #020 | li | 4969 | 2749 | #090 | no | 1830 | 1402 | #160 | iz | 1126 | 1898 |
| #021 | ic | 4963 | 2703 | #091 | pa | 1803 | 1393 | #161 | da | 1124 | 948 |
| #022 | nt | 4917 | 2684 | #092 | ns | 1796 | 1388 | #162 | pi | 1117 | 938 |
| #023 | or | 4884 | 2538 | #093 | ty | 1794 | 1378 | #163 | tt | 1117 | 938 |
| #024 | rl | 4807 | 2518 | #094 | po | 1778 | 1374 | #164 | tor | 1112 | 931 |
| #025 | ess | 4321 | 2504 | #095 | abl | 1172 | 1364 | #165 | gi | 1095 | 2784 |
| #026 | it | 4119 | 2502 | #096 | mo | 1761 | 1354 | #166 | cu | 1092 | 1846 |
| #027 | de | 4046 | 2426 | #097 | all | 1734 | 1353 | #167 | ant | 1091 | 918 |
| #028 | io | 4015 | 2382 | #098 | ad | 1727 | 2700 | #168 | per | 1090 | 918 |
| #029 | co | 4006 | 2346 | #099 | ate | 1714 | 1337 | #169 | ru | 1080 | 918 |
| #030 | ed | 3987 | 2345 | #100 | ct | 1705 | 1335 | #170 | rd | 1078 | 1792 |
| #031 | ng | 3967 | 2287 | #101 | ica | 1682 | 1334 | #171 | ver | 1074 | 1790 |
| #032 | ro | 3922 | 2274 | #102 | ous | 1666 | 1330 | #172 | sm | 1054 | 1788 |
| #033 | ca | 3734 | 2271 | #103 | rt | 1654 | 2644 | #173 | tiv | 1052 | 1774 |
| #034 | il | 3646 | 4446 | #104 | em | 1653 | 1315 | #174 | wa | 1050 | 883 |
| #035 | el | 3562 | 2222 | #105 | ci | 1648 | 1306 | #175 | ga | 1045 | 1756 |
| #036 | la | 3540 | 2191 | #106 | atio | 1645 | 1302 | #176 | ali | 1044 | 875 |
| #037 | ou | 3442 | 2132 | #107 | ot | 1622 | 1300 | #177 | lit | 1026 | 874 |
| #038 | ve | 3435 | 2127 | #108 | atior | 1622 | 1286 | #178 | ex | 1017 | 870 |
| #039 | ta | 3343 | 2089 | #109 | ine | 1617 | 1284 | #179 | rs | 1112 | 867 |
| #040 | un | 3326 | 2088 | #110 | am | 1610 | 1272 | #180 | sti | 1004 | 866 |
| #041 | nes | 3270 | 2063 | #111 | ut | 1551 | 1266 | #181 | lu | 1003 | 1726 |
| #042 | se | 3256 | 2044 | #112 | im | 1845 | 1254 | #182 | ow | 1002 | 861 |
| #043 | ness | 3105 | 2030 | #113 | ist | 1536 | 1250 | #183 | rat | 991 | 1718 |
| #044 | ma | 3087 | 2016 | #114 | os | 1524 | 1233 | #184 | sl | 988 | 853 |
| #045 | li | 3072 | 1945 | #115 | ck | 1523 | 1221 | #185 | fo | 976 | 852 |
| #046 | us | 3040 | 1942 | #116 | ig | 1500 | 2432 | #186 | gl | 971 | 1700 |
| #047 | ing | 3001 | 1931 | #117 | ive | 1494 | 2362 | #187 | tra | 966 | 2538 |
| #048 | di | 2958 | 1912 | #118 | id | 1490 | 1179 | #188 | qu | 956 | 1690 |
| #049 | ion | 2957 | 1909 | #119 | bi | 1489 | 3534 | #189 | men | 952 | 1666 |
| #050 | bl | 2943 | 1898 | #120 | ap | 1465 | 1162 | #190 | res | 949 | 827 |
| #051 | nd | 2940 | 1879 | #121 | oo | 1463 | 1156 | #191 | br | 938 | 1622 |

TABLE 2-continued

| Entry No. | Chara. strg. | Frequency count | Compress value | Entry No. | Chara. strg. | Frequency count | Compress value | Entry No. | Chara. strg. | Frequency count | Compress value |
|---|---|---|---|---|---|---|---|---|---|---|---|
| #052 | ea | 2934 | 1830 | #122 | aa | 1435 | 3468 | #192 | od | 938 | 1616 |
| #053 | ab | 2925 | 1803 | #123 | cal | 1433 | 1153 | #193 | ra | 931 | 1612 |
| #054 | to | 2869 | 1796 | #124 | lly | 1432 | 1129 | #194 | tive | 928 | 1608 |
| #055 | me | 2831 | 1778 | #125 | pi | 1427 | 1127 | #195 | and | 923 | 1604 |
| #056 | tr | 2825 | 1776 | #126 | able | 1403 | 1126 | #196 | fe | 918 | 799 |
| #057 | na | 2823 | 1774 | #127 | op | 1402 | 1124 | #197 | ip | 918 | 799 |
| #058 | si | 2792 | 1761 | #128 | sc | 1402 | 1123 | #198 | rr | 918 | 799 |
| #059 | he | 2782 | 1757 | #129 | su | 1393 | 1119 | #199 | man | 896 | 1592 |
| #060 | nl | 2749 | 1727 | #130 | ee | 1388 | 1117 | #200 | dis | 895 | 1586 |
| #060 | atl | 2719 | 3428 | #131 | ai | 1378 | 1117 | | | | |
| #062 | io | 2703 | 1677 | #132 | so | 1364 | 2224 | total | | | 382234 |
| #063 | pe | 2588 | 3332 | #133 | ba | 1354 | 1095 | | | | |
| #064 | ch | 2538 | 1654 | #134 | ir | 1353 | 1092 | | | | |
| #065 | tio | 2538 | 1653 | #135 | tlc | 1350 | 2182 | | | | |
| #066 | et | 2518 | 1648 | #136 | mp | 1337 | 2180 | | | | |
| #067 | ce | 2510 | 1622 | #137 | ie | 1335 | 1080 | | | | |
| #068 | ol | 2604 | 6488 | #138 | fi | 1334 | 1078 | | | | |
| #069 | ac | 2502 | 3234 | #139 | be | 1330 | 2148 | | | | |
| #070 | tion | 2398 | 1610 | #140 | con | 1322 | 2148 | | | | |

Then, a compression contribution value when each character string having n characters, i.e., n bytes, in the statistics data is replaced with a one byte code is calculated (step S120). Sequentially, the entries in the statistic table are sorted in the descending order of their compression contribution values (step S122). As is described above, a compression contribution value is acquired by multiplying the frequency count and a difference of bytes (n−1).

At step S124, overlaps in the statistics are removed. An overlap in the statistics is, for example, where for a long character string "ABCD," the frequency counts for shorter character strings "ABC," I²BCD," "AB," "IBC" and "CD," which are included in "ABCD," are obtained by overlapping the frequency count of the string "ABCD." Since the longer character string has a greater compression contribution value, the long character string should remain in the statistic table. Therefore, the frequency count for the character string "ABCD" must be subtracted from the frequency counts in the individual entries for the short character strings "ABC," "BCD," "AB," "BC" and "CD." For example, when the frequency counts for "ation" and "tion," in the statistic table generated immediately after the first IF loop is terminated, are 1622 and 2398, the frequency count 1622, which is a double count for "ation," is subtracted from the frequency count 2398 of "tion," and the value 776 (=2398−1622) is the true frequency count for the character string "tion."

After the overlaps of the statistics are removed at step S124, the entries in the statistic table are sorted again in accordance with the descending order of the compression contribution values (step S126).

Table 3 shows a statistic table obtained by sorting the entries in accordance with their compression contribution values. This is the result obtained by processing the entry word index data in a system dictionary included in the "King of Translation."

TABLE 3

| Entry No. | Chara. strg. | Frequency count | Compress value | Entry No. | Chara. strg. | Frequency count | Compress value | Entry No. | Chara. strg. | Frequency Count | Compress value |
|---|---|---|---|---|---|---|---|---|---|---|---|
| #001 | ness | 3105 | 9315 | #071 | ul | 2016 | 2016 | #141 | nc | 1449 | 1449 |
| #002 | ation | 1622 | 6488 | #012 | stl | 1004 | 2008 | #142 | sa | 1435 | 1435 |
| #003 | ing | 3001 | 6002 | #073 | rat | 991 | 1982 | #143 | pi | 1427 | 1427 |
| #004 | ar | 5021 | 5021 | #074 | is | 1945 | 1945 | #144 | sta | 706 | 1412 |
| #005 | re | 4960 | 4960 | #075 | hi | 1942 | 1942 | #145 | ect | 705 | 1410 |
| #006 | ter | 2223 | 4446 | #076 | tra | 966 | 1932 | #146 | nal | 704 | 1408 |
| #007 | able | 1403 | 4209 | #077 | ic | 1931 | 1931 | #147 | tri | 703 | 1406 |
| #008 | ly | 4147 | 4147 | #078 | it | 1912 | 1912 | #148 | op | 1402 | 1402 |
| #009 | ed | 3987 | 3987 | #079 | re | 1909 | 1909 | #149 | sc | 1402 | 1402 |
| #010 | or | 3772 | 3772 | #080 | ge | 1898 | 1898 | #150 | su | 1393 | 1393 |
| #011 | ie | 3645 | 3645 | #081 | res | 949 | 1898 | #151 | ari | 695 | 1390 |
| #012 | el | 3562 | 3562 | #082 | me | 1879 | 1879 | #152 | ee | 1388 | 1388 |
| #013 | ally | 1178 | 3534 | #083 | and | 923 | 1846 | #153 | ai | 1378 | 1378 |
| #014 | ical | 1156 | 3468 | #084 | no | 1830 | 1830 | #154 | us | 1374 | 1374 |
| #015 | ate | 1714 | 3428 | #085 | pa | 1803 | 1803 | #155 | com | 685 | 1310 |
| #016 | er | 3363 | 3363 | #086 | ns | 1796 | 1796 | #156 | so | 1364 | 1364 |
| #017 | ta | 3343 | 3343 | #087 | man | 896 | 1792 | #157 | ba | 1354 | 1354 |
| #018 | ous | 1666 | 3332 | #088 | dis | 895 | 1790 | #158 | ism | 677 | 1354 |
| #019 | un | 3326 | 3326 | #089 | nde | 894 | 1788 | #159 | ir | 1353 | 1353 |
| #020 | ri | 3323 | 3323 | #090 | po | 1778 | 1778 | #160 | ize | 676 | 1352 |
| #021 | se | 3256 | 3256 | #091 | ou | 1776 | 1776 | #161 | ato | 674 | 1348 |
| #022 | ine | 1617 | 3234 | #092 | in | 1774 | 1774 | #162 | ina | 672 | 1344 |
| #023 | ist | 1536 | 3072 | #093 | lin | 887 | 1774 | #163 | mp | 1337 | 1337 |
| #024 | ro | 3059 | 3059 | #094 | mo | 1761 | 1761 | #164 | ie | 1335 | 1335 |

TABLE 3-continued

| Entry No. | Chara. strg. | Frequency count | Compress value | Entry No. | Chara. strg. | Frequency count | Compress value | Entry No. | Chara. strg. | Frequency Count | Compress value |
|---|---|---|---|---|---|---|---|---|---|---|---|
| #025 | ent | 1501 | 3002 | #095 | to | 1757 | 1757 | #165 | fi | 1334 | 1334 |
| #026 | ea | 2934 | 2934 | #096 | der | 878 | 1756 | #166 | be | 1330 | 1330 |
| #027 | an | 2797 | 2797 | #097 | ad | 1727 | 1727 | #167 | cr | 1315 | 1315 |
| #026 | si | 2792 | 2792 | #098 | pro | 863 | 1726 | #168 | gr | 1306 | 1306 |
| #029 | tive | 928 | 2784 | #099 | nte | 859 | 1718 | #169 | ke | 1302 | 1302 |
| #030 | ia | 2775 | 2775 | #100 | ili | 850 | 1700 | #170 | og | 1300 | 1300 |
| #031 | nl | 2749 | 2749 | #101 | tin | 845 | 1690 | #171 | ry | 1286 | 1286 |
| #032 | lo | 2703 | 2703 | #102 | ce | 1677 | 1677 | #172 | bo | 1284 | 1284 |
| #033 | tic | 1350 | 2700 | #103 | nce | 833 | 1666 | #173 | vi | 1272 | 1272 |
| #034 | co | 2684 | 2684 | #104 | rt | 1654 | 1654 | #174 | sp | 1266 | 1266 |
| #035 | con | 1322 | 2644 | #105 | em | 1653 | 1653 | #175 | tu | 1254 | 1254 |
| #036 | ch | 2538 | 2538 | #106 | cl | 1648 | 1648 | #176 | ag | 1250 | 1250 |
| #037 | enes | 846 | 2538 | #107 | ot | 1622 | 1622 | #177 | he | 1233 | 1233 |
| #036 | et | 2618 | 2538 | #108 | str | 811 | 1622 | #178 | ph | 1221 | 1221 |
| #039 | ol | 2504 | 2504 | #109 | pre | 808 | 1616 | #179 | um | 1179 | 1179 |
| #040 | ac | 2502 | 2502 | #110 | les | 806 | 1612 | #180 | li | 1162 | 1162 |
| #041 | ess | 1216 | 2432 | #111 | am | 1610 | 1610 | #181 | oc | 1156 | 1156 |
| #042 | on | 2426 | 2426 | #112 | her | 804 | iWs | #182 | ab | 1153 | 1153 |
| #043 | mi | 2382 | 2382 | #113 | th | 1605 | 1605 | #183 | do | 1129 | 1129 |
| #044 | ity | 1181 | 2362 | #114 | int | 802 | 1604 | #184 | ep | 1127 | 1127 |
| #045 | ia | 2346 | 2346 | #115 | est | 796 | 1592 | #185 | iz | 1126 | 1126 |
| #446 | en | 2345 | 2345 | #116 | ete | 793 | 1586 | #186 | da | 1124 | 1124 |
| #047 | tion | 776 | 2328 | #117 | ut | 1551 | 1551 | #187 | nd | 1123 | 1123 |
| #048 | ur | 2287 | 2287 | #118 | im | 1545 | 1545 | #188 | ss | 1119 | 1119 |
| #049 | de | 2274 | 2274 | #119 | era | 767 | 1534 | #189 | pl | 1117 | 1117 |
| #050 | as | 2271 | 2271 | #120 | ist | 765 | 1530 | #190 | tt | 1117 | 1117 |
| #051 | tor | 1112 | 2224 | #121 | nti | 765 | 1530 | #191 | gi | 1095 | 1095 |
| #052 | il | 2222 | 2222 | #122 | os | 1524 | 1524 | #192 | cu | 1092 | 1092 |
| #053 | ment | 734 | 2202 | #123 | ck | 1523 | 1523 | #193 | ru | 1080 | 1080 |
| #054 | ma | 2191 | 2191 | #124 | cti | 753 | 1506 | #194 | rd | 1078 | 1078 |
| #055 | ant | 1091 | 2182 | #125 | sh | 1503 | 1503 | #195 | sm | 1054 | 1054 |
| #056 | per | 1090 | 2180 | #126 | ran | 751 | 1502 | #196 | wa | 1050 | 1050 |
| #057 | ati | 1074 | 2148 | #127 | ig | 1500 | 1500 | #197 | tr | 1048 | 1048 |
| #058 | ver | 1074 | 2148 | #128 | pe | 1498 | 1498 | #198 | ga | 1045 | 1045 |
| #059 | lity | 711 | 2133 | #129 | ish | 747 | 1494 | #199 | ex | 1017 | 1017 |
| #060 | ec | 2132 | 2132 | #130 | eri | 746 | 1492 | #200 | rs | 1012 | 1012 |
| #061 | ha | 2127 | 2127 | #131 | id | 1490 | 1490 | | | | |
| #062 | call | 708 | 2124 | #132 | the | 745 | 1490 | | total | | 490898 |
| #063 | na | 2089 | 2089 | #133 | bi | 1489 | 1489 | | | | |
| #064 | om | 2068 | 2088 | #134 | rin | 738 | 1476 | | | | |
| #065 | ali | 1044 | 2088 | #135 | ona | 734 | 1468 | | | | |
| #066 | di | 2063 | 2063 | #136 | ap | 1465 | 1465 | | | | |
| #067 | lit | 1026 | 2052 | #137 | oo | 1463 | 1463 | | | | |
| #068 | al | 2044 | 2044 | #138 | ted | 730 | 1460 | | | | |
| #069 | ines | 677 | 2031 | #139 | gra | 727 | 1454 | | | | |
| #070 | ho | 2030 | 2030 | #140 | min | 727 | 1454 | | | | |

As is apparent from Table 3, the compression contribution value 9315 for character string "ness," which is the first entry, is the highest, and compression contribution value 6488 for character string "ation" is the second highest.

Figure 4:
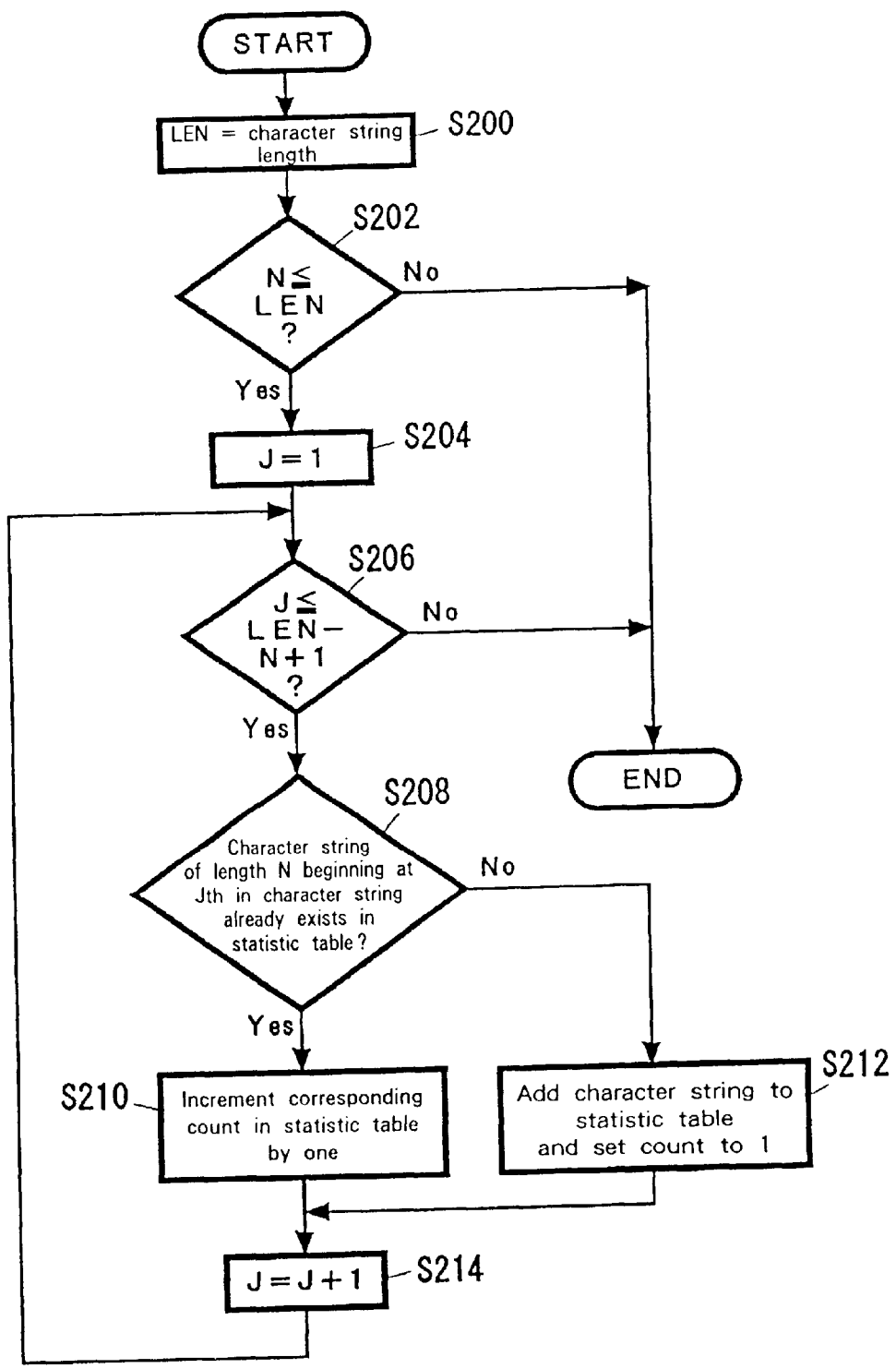
FIG. 4 is a detailed flowchart showing the n-gram statistical analysis process routine at step S108 (first embodiment).

FIG. 4 is a detailed flowchart showing the n-gram statistical analysis process routine at step S108. The individual steps will now be described.

At step S200, the length of a character string for an entry word that is being processed (i.e., it is substituted into the variable REST) is substituted into variable LEN. At step S202 a check is performed to determine whether N is equal to or smaller than LEN. When N exceeds LEN, the n-gram statistical analysis process is not required (there are no n-gram statistics for character strings having (N−1) characters, for example). Program control exits at branch "No" at decision block S202 and the process routine is terminated. When N is equal to or smaller than LEN, program control branches to "Yes" and the following process is performed.

At step S204 a value of 1 is substituted into variable J. The variable J is a variable for designating a character string segment that consists of the Jth and the following characters of the character string REST.

In the IF loop constituted by a conditional sentence (S206), "Is J equal to or smaller than LEN−N+1, " the n-gram statistic analysis is conducted for character strings having N characters, which are included in the character string segment consisting of the Jth and following characters of the character string REST in the process. When J exceeds LEN−N+1, no character strings having N or more characters remain in the segment consisting of Jth and following characters of the character string REST. Program control exits at branch "No" at decision block S206 and the process routine is terminated. When J is equal to or smaller than LEN−N+1, the following step is performed.

At step S208 a check is performed to determine whether a character string having N characters beginning with the Jth character of the character string REST already exists in the statistic table. If REST="ABCD," and J=2 and N=2, a check is performed to determine whether character string BC, which consists of two characters beginning with the second character of the character string ABCD, is present in the statistic table. If a corresponding entry exists in the statistic table, the frequency count of the entry is incremented by one (step S210). When no such entry is found in the statistic table, a new entry is added and its frequency count is set to 1 (step S212).

The n-gram statistical analysis has been conducted for a character string having N characters beginning at the Jth character of the character string REST, and J is incremented by one (step S214). Program control then returns to step S206 to repeat the n-gram statistical analysis for a character string having N characters beginning at the (J+1)th character.

Generation of character translation code table:

the ASCII code table, and conventional codes are assigned unchanged for regular alphanumerical characters, such as a, b, c . . . and 0, 1, 2, . . . (in Table 4, the conventional column assignments in the ASCII code table displayed are enclosed in frames). A character string "ab" having a high compression contribution value is assigned for unused column 0x01 in the ASCII code table, and character string "ot" is assigned for unused column 0xc9 in the table.

TABLE 4

|  | 00 | 01 | 02 | 03 | 04 | 05 | 06 | 07 | 08 | 09 | 0a | 0b | 0c | 0d | 0e | 0f |
|---|---|---|---|---|---|---|---|---|---|---|---|---|---|---|---|---|
| 0 × 00 | (null) | ab | able | ac | ad | ag | ai | al | ali | ally | am | an | and | ant | ap | ar |
| 0 × 10 | ari | as | ate | atiation |  | ato | ba | be | bi | bo | call | ce | ch | ci | ck | co |
| 0 × 20 | (space) | ! | " | # | $ | % | & | ' | ( | ) | * | + | , | - | . | / |
| 0 × 30 | 0 | 1 | 2 | 3 | 4 | 5 | 6 | 7 | 8 | 9 | : | ; | < | = | > | ? |
| 0 × 40 | @ | com | con | cr | cti | de | der | di | dis | do | ea | ec | ect | ed | ee | el |
| 0 × 50 | em | en | enes | ent | ep | er | era | eri | ess | est | et | ~ | ¥ | ] | ^ |  |
| 0 × 60 | ' | a | b | c | d | e | f | g | h | i | j | k | l | m | n | o |
| 0 × 70 | p | q | r | s | t | u | v | w | x | y | z | [ | \| | ] |  | . |
| 0 × 80 | fi | ge | gr | gra | ha | he | her | hi | ho | ia | ic | ical | id | ie | ig | il |
| 0 × 90 | ili | im | in | ina | ine | ines | ing | int | ir | is | ish | ism | ist | it | ity | iz |
| 0 × a0 | ize | ke | la | lat | le | les | li | lin | lit | lity | lo | ly | ma | man | me | ment |
| 0 × b0 | mi | min | mo | mp | na | nal | nc | nce | nde | ness | ni | no | ns | nte | nti | oc |
| 0 × c0 | og | ol | om | on | ona | oo | op | or | os | ot | ou | ous | pa | pe | per | ph |
| 0 × d0 | pi | po | pre | pro | ra | ran | rat | re | res | ri | rin | ro | rt | ry | sa | sc |
| 0 × e0 | se | sh | si | so | sp | sta | ste | sti | str | su | ta | ted | ter | th | the | tic |
| 0 × f0 | tin | tion | tive | to | tor | tra | tri | tu | ul | um | un | ur | us | ut | ver | vi |

After the statistic table has been prepared in which entries are arranged in accordance with the descending order of their compression contribution values in the process routine in FIGS. 3 and 4, a character code translation table for replacing a character string with code is generated. To embody the present invention, a new table for translating characters into code may be designed. In this embodiment, an ASCII (American Standard Code for Information Interchange) code table is employed that is well known and widely used as a table for assigning alphanumerical characters to code, and unused columns in this code table are newly assigned for character strings having high compression contribution values. The advantage of the employment of the ASCII code table is that conventional code can be used unchanged for regular alphanumerical characters, such as a, b, c, . . . and 0, 1, 2, . . . . The ASCII code table conforms to the specifications established by ANSI (American National Standards Institute).

Figure 5:
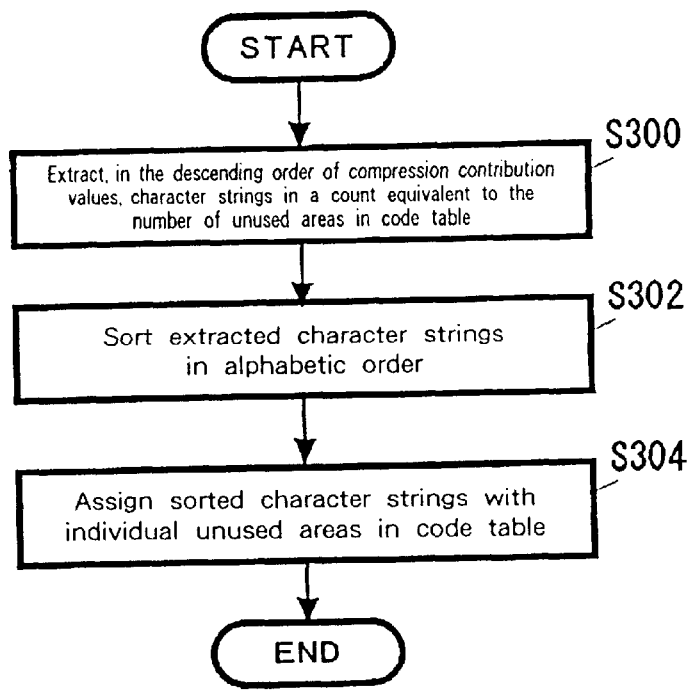
FIG. 5 is a flowchart showing a process routine for generating a new character translation code table according to the compression contribution values in accordance with the n-gram statistical analysis processing (first embodiment).

FIG. 5 is a flowchart showing a process routine for generating a new character translation code table in accordance with compression contribution values obtained in the n-gram statistical analysis process. The individual steps will now be explained.

First, character strings in a count equivalent to the number of unused areas in the character translation code table are extracted from the high ranks of the statistic table (step S300). When the ASCII code table is used as the character translation code table, there are 185 unused columns (a case where English capital letters are not used), and only 185 highly ranked entries in the statistic table need be acquired.

Then, the obtained character strings are sorted in alphabetical order (step S302). Each of the sorted character strings is assigned a position, beginning with the first unused area of the character translation code table (step S304). The character strings are assigned positions in alphabetical order because this facilitates the performance of a following dictionary search process, which will be described later.

Table 4 shows a character translation code table prepared during the process routine in FIG. 5. The table is based on It should be noted that Table 4 shows the results obtained by processing the previously described entry word index data in a system dictionary included in the "King of Translation."

Generation of dictionary entry word index:

When a new character translation code table is prepared, this is employed to generate a new dictionary entry word index. In Table 4 representing character translation code, a character string having n characters, i.e., n bytes (n is an integer greater than 1) is replaced with a one-byte code (previously described). Among the entry words, since a character string of n bytes that has a high compression contribution value is replaced by one byte code in accordance with the character translation code table, a compression effect of (n−1) bytes can be provided by preparing a new entry word index.

Figure 6:
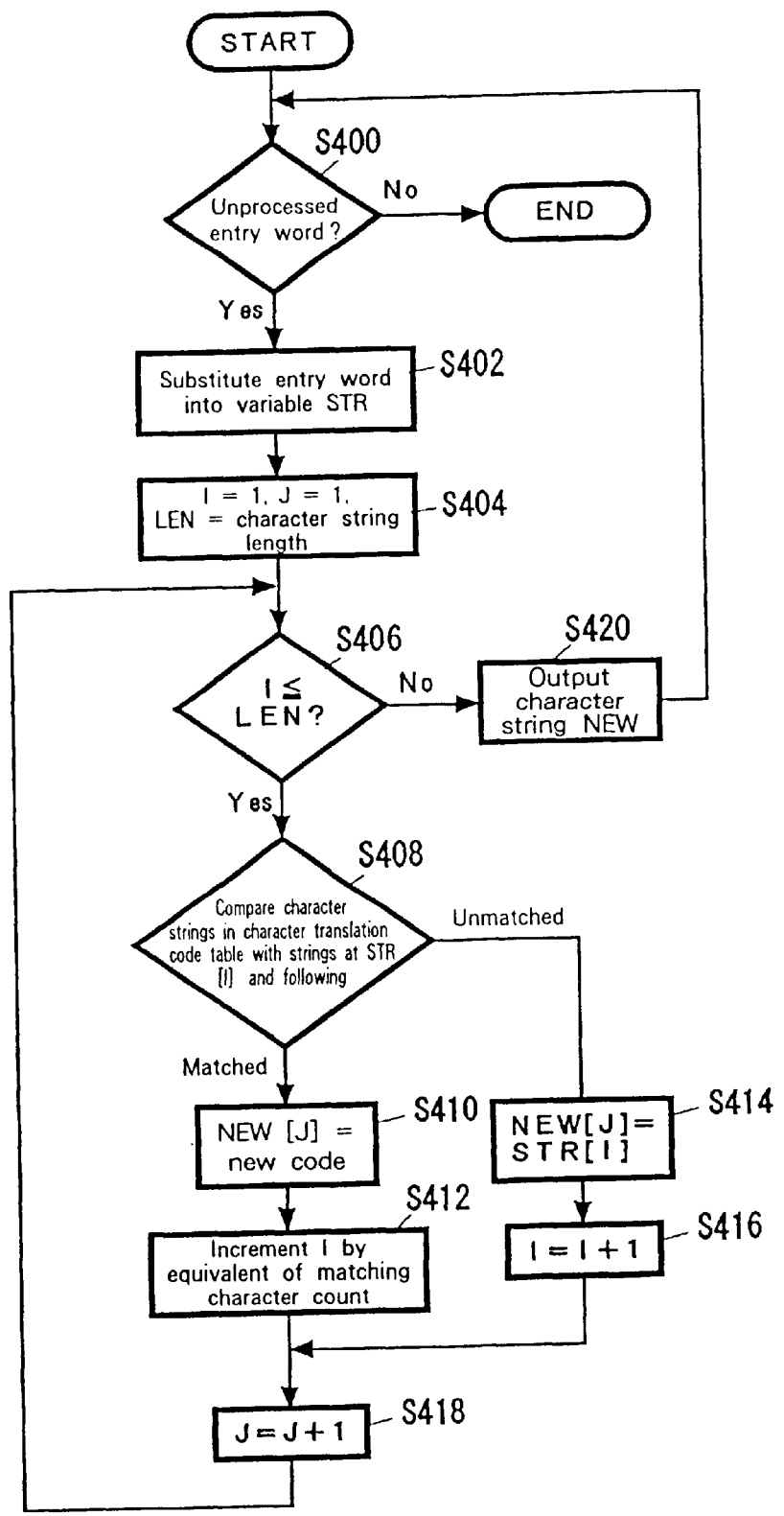
FIG. 6 is a flowchart showing a process routine for generating a dictionary entry word index (first embodiment).

FIG. 6 is a flowchart showing the process routine for generating (compressing) a dictionary entry word index. The individual steps will now be explained.

The first IF loop, constituted by the conditional sentence (step S400), "Is there an unprocessed entry word?," initiates the compression process for the entire entry word index.

In the first IF loop, the first remaining entry word is extracted from the original entry word index, and is substituted into a variable STR (step S402). An initial value of 1 is substituted into variables I and J, and the length of the character string STR is substituted into variable LEN (step S404). The variable I is used to designate the Ith character of the original character string STR, and the variable J is used to designate the Jth character of a new character string NEW.

In the second IF loop, constituted by the conditional sentence (step S406), "Is I equal to or smaller than LEN," the compression process for the character string STR is performed. In the compression process, the individual character string segments of the character string STR are replaced by codes from the character translation code table.

First, a character string segment that consists of the Ith and the following characters of the character string STR is compared with each character string in the character translation code table shown as Table 4 (step S408). This comparison is performed in the reverse direction, starting at the last entry in the character translation code table. Since character strings are assigned in the character translation code table in alphabetic order (see Table 4), the table is searched in the reverse direction so that character string having more characters can be examined first in the comparison process. When, for example, a character string segment "lity" exists at the Ith and the following characters of the character string STR, "lit" and "lity" are selected as candidate matching character strings in the Table 4, and the character string segment is first compared with "lity," which appears later in the alphabet order (i.e., has more characters).

If a character string that matches the character string segment that consists of the Ith and the following characters of the character string STR is found in the character translation code table, the matching code is substituted into the Jth character of a new character string NEW (step S410), and the variable I is incremented by a number equivalent to the number of characters of this matching character string (step S412). For example, when the segment that consists of the Ith and the following characters of the string STR includes a 4-byte character string "ness," the character string segment is replaced by a one-byte character "b9," in accordance with the character translation code table. At this time, the variable I is incremented by four.

If in the code table there is no character string that matches the character string segment that consists of the Ith and the following characters of the character string STR, the Ith character of the original character string STR is substituted into the Jth character string of the new character string NEW (step S414), and the variable I is incremented by one (step S416).

After a matching code, or one character of the original string, is substituted into the Jth character of the new character string NEW, and the variable J is incremented by one (step S418), program control returns to step S406 to repeat the above described IF loop processing. When the variable I exceeds the character string length LEN, it means that the process for translating the original character string STR into the new character string NEW has been terminated. Program control exits the second IF loop at branch "No" at decision block S406. At step S420, the original entry STR in the entry word index is replaced by the translated code NEW, and program control thereafter returns to step S400.

At step S400, a check is performed to determine whether unprocessed entry words remain in the entry word index. If so, the above described process is repeated for the remaining entry words. If there is no unprocessed entry word, it is assumed that the entire entry word index has been processed. Program control thereafter exits the routine at branch "No" at decision block S400, and the processing routine is terminated.

Table 5 shows one part of the new entry word index that is generated while being compared with the original entry words. In the new entry word index, one byte numbers are listed using the hexadecimal numbering system.

TABLE 5

| New entry word index | Original entry word index | New entry word index | Original entry word index |
| --- | --- | --- | --- |
| 61 2d 19 6d 62 | a - bo m b | 01 47 63 15 72 | ab di c ato r |
| 61 2d 63 0e cd 6c 82 | a - c ap pe l la | 01 49 ae 6e | ab do me n |
| 61 2d 45 75 78 | a - de u x | 01 49 b1 07 | ab do min al |
| 61 2d 66 c3 64 | a - f on d | 01 49 b1 09 | ab do min ally |
| 61 2d 66 c7 74 69 c7 69 | a - f or t i or i | 01 64 75 63 74 | ab d u c t |
| 61 2d a2 2d 63 0f 74 65 | a - la - c ar t e | 01 64 15 44 c3 | ab d u cti on |
| 61 2d a2 2d 6b 96 | a - la - k ing | 01 64 75 63 f4 | ab d u c tor |
| 61 2d a2 2d b2 45 | a - a - mo de | 01 4a 6d | ab ea m |
| 61 2d a4 76 4f | a - le v el | 01 4b 4d 10 0b | ab ec ed ari an |
| 61 2d 6e f9 17 72 | a - n um be r | 01 Ad | ab ed |
| 61 2d d1 e6 d9 c7 69 | a - po ste ri or i | 01 4f 65 | ab el e |
| 61 2d 70 d9 c7 69 | a - p ri or i | 01 55 d5 1b | ab er ran ce |
| 61 2d 74 50 d1 | a - t em po | 01 55 d5 63 79 | ab er ran c y |
| 61 2e 63 2e | a . c . | 01 55 d5 74 | ab er ran t |
| 61 2e 6d 2e | a . m . | 01 55 d5 74 ab | ab er ran t ly |
| 61 2e 77 2e 6f 2e 6c 2e | a . w . o . l . | 01 55 d5 69 c3 | ab er rat i on |
| 61 2f 63 | a / c | 01 55 69 c4 6c | ab er rat i ona l |
| 61 0f 64 76 0f 6b | a ar d v ar k | 01 5a | ab et |
| 01 2d 92 9d 69 6f | ab - in it i o | 01 5a af | ab et ment |
| 01 2e | ab . | 01 5a ec | ab et ter |
| 01 03 69 | ab ac i | 01 5a f4 | ab et tor |
| 01 03 6b | ab ac k | 01 65 79 0b 1b | ab e y an ce |
| 01 03 fc | ab ac us | 01 65 79 0d | ab e y ant |
| 01 61 66 74 | ab a f t | 01 88 72 | ab ho r |
| 01 07 c3 65 | ab al on e | 01 88 72 d7 b7 | ab ho r re nce |
| 01 0c c3 | ab and on | 01 88 72 d7 6e 74 | ab ho r re n t |
| 01 0c c3 4d | ab and on ed | 01 88 72 d7 6e 74 ab | ab ho r re n t ly |
| 01 0c c3 55 | ab and on er | 01 88 72 d7 72 | ab ho r re r |
| 01 0c c3 af | ab and on ment | 01 8c 0b 1b | ab id an ce |
| 01 11 65 | ab as e | 01 8c 65 | ab id e |
| 01 11 50 53 | ab as em ent | 01 8c 55 | ab id er |
| 01 11 68 | ab as h | 01 6c 96 | ab id ing |
| 01 11 85 64 | ab as he d | 01 90 74 8d 73 | ab ili t ie s |
| 01 11 68 af | ab as h ment | 01 90 74 79 | ab ili t y |
| 01 61 ea 62 a4 | ab a ta b le | 01 6a 4c | ab j ect |
| 01 12 | ab ate | 01 6a 69 c3 | ab j ect i on |
| 01 12 af | ab ate ment | 01 6a 4c ab | ab j ect ly |

TABLE 5-continued

| New entry word index | Original entry word index | New entry word index | Original entry word index |
|---|---|---|---|
| 01 13 73 | ab ati s | 01 6a 4c b9 | ab j ect ness |
| 01 61 74 74 99 | ab a t t is | 01 6a fb 14 | ab j ur ation |
| 01 61 14 f3 18 | ab a t to ir | 01 6a fb 65 | ab j ur e |
| 01 16 63 79 | ab ba c y | 01 6a fb 55 | ab j ur er |
| 01 16 74 89 6c | ab ba t ia l | 01 a3 65 | ab lat e |
| 01 17 73 73 | ab be s s | 01 a3 69 c3 | ab lat i on |
| 01 17 79 | ab be y | 01 a3 69 75 65 | ab lat i v e |
| 01 19 74 | ab bo t | 01 a2 fd | ab la ut |
| 01 62 72 2e | ab b r | 01 a2 7a 65 | ab la z e |
| 01 62 d7 76 2e | ab b re v. | 02 | able |
| 01 62 d7 ff 12 | ab b re vi ate | | |
| 01 62 d7 ff 14 | ab b re vi ation | | |
| 01 62 d7 ff 15 72 | ab b re vi ato r | | |
| 01 47 63 02 | ab di c able | | |
| 01 47 63 12 | ab di c ate | | |
| 01 47 63 14 | ab di c ation | | |

As is apparent from Table 5, entry word "a-bomb" is compressed into five bytes of code, "61 2d 19 6d 62," whereas entry word "abandon," which has seven characters, i.e., seven bytes, is replaced by the three-byte code "01 0c c3," so that a compression effect of four bytes is obtained. Entry word "able," which has four characters, i.e., four bytes, is replaced by the one-byte code "02," so that a compression effect of three bytes is obtained.

As an experimental result, when the compression method in this embodiment was applied for the entry word index of the system dictionary for the "King of Translation," the original entry word index of 625 Kbytes was compressed to a length of 388 Kbytes. When the amount of entry word index data is small, they can be made resident in the main memory 14 of the computer system 100, without being exchanged (swapped out). Since the access speed for memory-resident data is high, an increase in the dictionary search speed is obtained. Especially for a machine translation system that prepares some dictionaries, the compression of data to reduce its Isize is very effective when it is desired to make the entry word index data memory resident.

C-2. Second embodiment

A second embodiment for compressing entry word index data will now be described while referring to FIGS. 7 to 11. The second embodiment differs from the first embodiment in that a difference between entry word character strings that are adjacent to each other is acquired prior to the performance of a compression process based on the n-gram statistical analysis.

Figure 7:
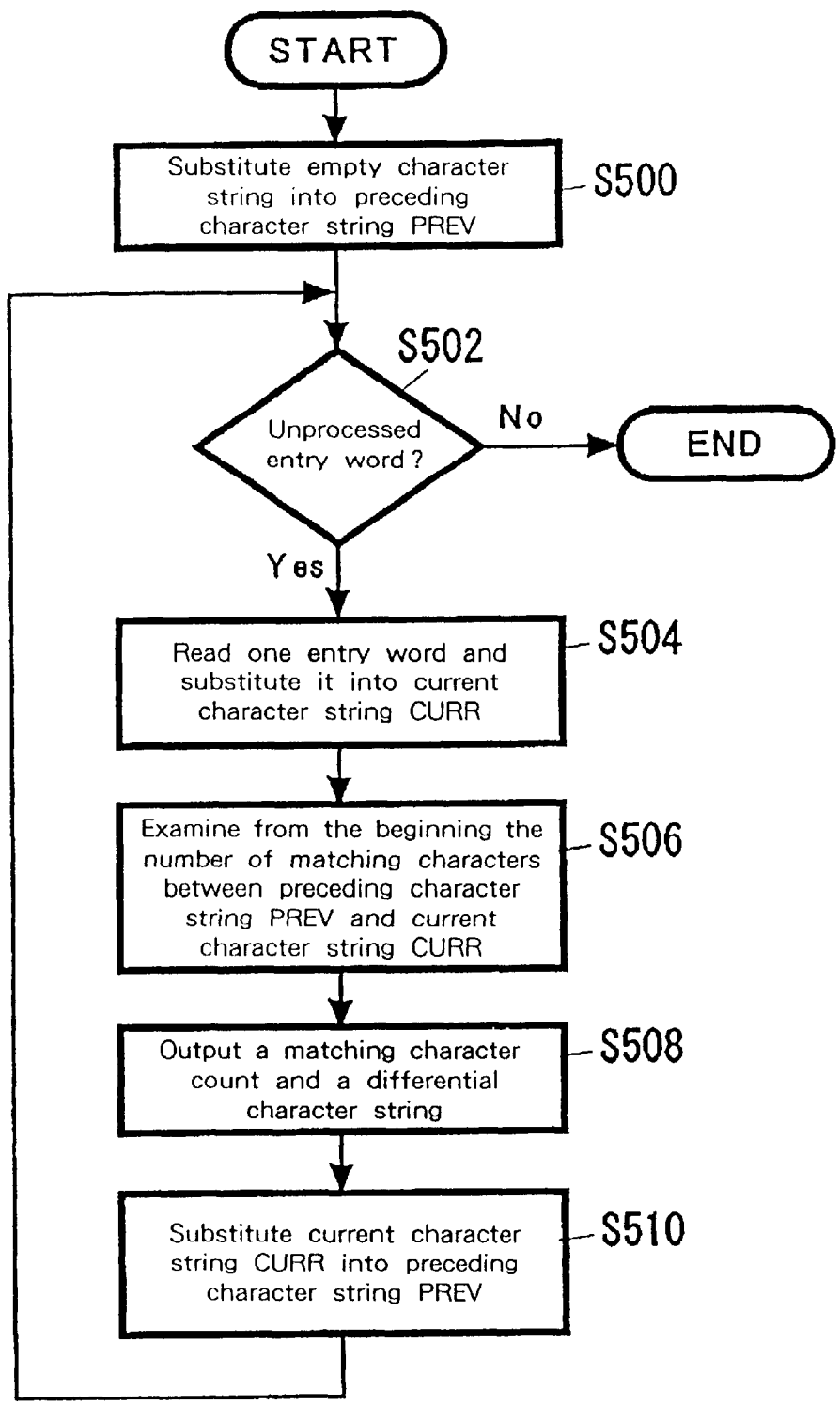
FIG. 7 is a flowchart showing a process routine for acquiring a difference between entry words that are adjacent to each other (second embodiment).

Differential process for entry word index data:

FIG. 7 is a flowchart showing the process routine for calculating a difference between adjacent entry word character strings. The individual steps will now be explained.

An empty character is entered as an immediately preceding character string PREV (step S500).

An IF loop, constituted by the conditional sentence (step S502), "Is there an unprocessed entry word?," initiates the differential process for all the entry words.

In the IF loop, initially, the first remaining entry word character string is extracted from the original entry word index, and is substituted into the current character string CURR (step S504).

Then, a check is performed to determine how many characters starting at the beginning of the preceding character string PREV match those in the current character string CURR (step S506). The count of the matching characters and the difference in the character strings PREV and CURR are output (step S508).

The current character string CURR is substituted into the immediately preceding character string PREV (step S510), and program control returns to step S502.

At step S502, the acquisition of an entry word remaining in the original entry word index is attempted. If there is an unprocessed entry word, program control branches to "Yes" at the decision block S502, and the above described differential process is repeated. If the differential process has been completed for all the entry words, program control exits the routine at branch "No" at decision block S502, and the process routine is terminated.

Table 6 shows one part of the entry word index for which the differential process is performed while being compared with the original entry word index. The character string "a-bomb" is defined as the head of the entry word index. The original entry word index is that of a system dictionary in the "King of Translation."

TABLE 6

| Matching chara. count | Differential character string | Original character string | Matching chara. count | Differential character string | Original character string |
|---|---|---|---|---|---|
| 00 | a-bomb | a-bomb | 06 | te | abdicate |
| 02 | cappella | a-cappella | 07 | ion | abdication |
| 02 | deux | a-deux | 07 | or | abdicator |
| 02 | fond | a-fond | 03 | omen | abdomen |
| 04 | rtiori | a-fortiori | 05 | inal | abdominal |
| 02 | la-carte | a-la-carte | 09 | ly | abdominally |
| 05 | king | a-la-king | 03 | uct | abduct |

TABLE 6-continued

| Matching chara. count | Differential character string | Original character string | Matching chara. count | Differential character string | Original character string |
|---|---|---|---|---|---|
| 05 | mode | a-la-mode | 06 | ion | abduction |
| 03 | evel | a-level | 06 | or | abductor |
| 02 | number | a-number | 00 | abeam | abeam |
| 02 | posteriori | a-posteriori | 03 | cedarian | abecedarian |
| 03 | riori | a-priori | 03 | d | abed |
| 02 | tempo | a-tempo | 03 | le | abele |
| 00 | a.c. | a.c. | 03 | rrance | aberrance |
| 02 | m. | a.m. | 08 | y | aberrancy |
| 02 | w.o. l. | a.w.o.l. | 07 | t | aberrant |
| 01 | /c | a/c | 08 | ly | aberrantly |
| 01 | ardvark | aardvark | 06 | tion | aberration |
| 01 | b-initio | ab-initio | 0a | al | aberrational |
| 02 |  | ab. | 03 | t | abet |
| 00 | abaci | abaci | 04 | ment | abetment |
| 04 | k | aback | 04 | ter | abetter |
| 04 | us | abacus | 05 | or | abettor |
| 03 | ft | abaft | 03 | yance | abeyance |
| 03 | lone | abalone | 06 | t | abeyant |
| 03 | ndon | abandon | 00 | abhor | abhor |
| 07 | ed | abandoned | 05 | rence | abhorrence |
| 08 | r | abandoner | 08 | t | abhorrent |
| 07 | ment | abandonment | 09 | ly | abhorrently |
| 03 | se | abase | 07 | r | abhorrer |
| 05 | ment | abasement | 00 | abidance | abidance |
| 04 | h | abash | 04 | e | abide |
| 05 | ed | abashed | 05 | r | abider |
| 05 | ment | abasement | 04 | ing | abiding |
| 00 | abatable | abatable | 03 | lities | abilities |
| 04 | e | abate | 06 | y | ability |
| 05 | ment | abatement | 02 | ject | abject |
| 04 | is | abatis | 06 | ion | abjection |
| 04 | tis | abattis | 06 | ly | abjectly |
| 05 | oir | abattoir | 06 | ness | abjectness |
| 00 | abbacy | abbacy | 03 | uration | abjuration |
| 04 | tial | abbatial | 05 | e | abjure |
| 03 | ess | abbess | 06 | r | abjurer |
| 04 | y | abbey | 00 | ablate | ablate |
| 03 | ot | abbot | 05 | ion | ablation |
| 03 | r. | abbr. | 06 | ve | ablative |
| 04 | ev. | abbrev. | 04 | ut | ablaut |
| 06 | iate | abbreviate | 04 | ze | ablaze |
| 09 | ion | abbreviation | 03 | e | able |
| 09 | or | abbreviator |  |  |  |
| 00 | abdicable | abdicable |  |  |  |

Figure 8:
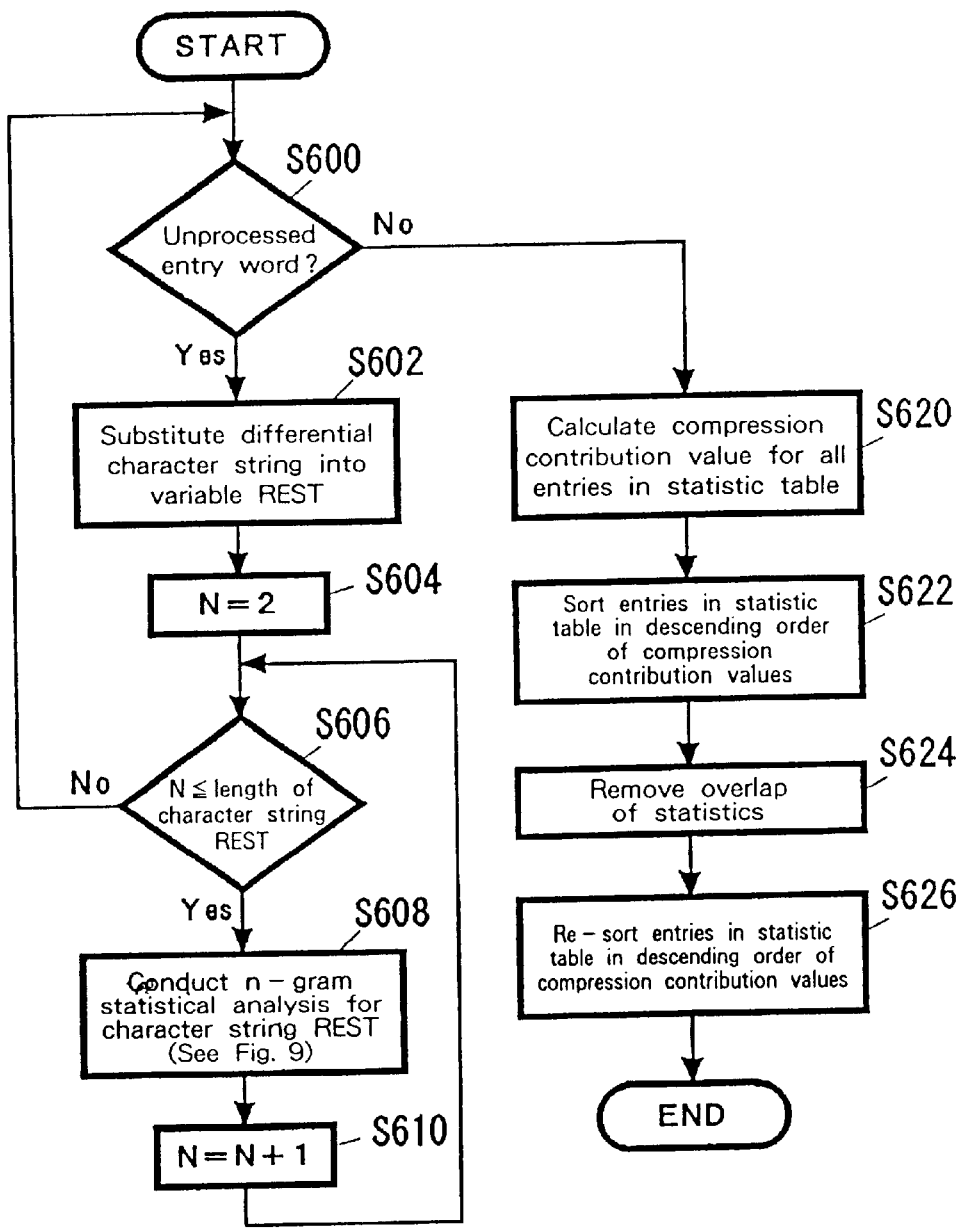
FIG. 8 is a flowchart for the processing for calculating the compression contribution values of individual differential character strings (second embodiment).

As is shown in Table 6, since the first to the sixth characters of entry word "abjection," which is just below "abject," match the character string "abject," the matching character count 06 and a differential character string "ion" form a new entry word. Further, since the first to the sixth characters of the next entry word "abjectly," which is in the two line below from "abject," match the immediately preceding entry word "abjection," the matching character count 06 and a differential character string "ly" forms a new entry word. An entry word index for which the differential process is performed is hereinafter called a "tentative entry word index."

n-gram statistical analysis process:

FIG. 8 is a flowchart showing the processing for calculating a compression contribution value for each entry word. The processing is positioned as a pre-process for the tentative entry word index data compression processing.

The compression contribution value represents the compression effect imposed on the tentative entry word index data when a character string of n characters (i.e., n bytes) or more is replaced by a character string of less than n characters (one byte in this case). It would be easily understood that the compression contribution value is large when a character string that frequently appears in a tentative entry word index, or a character string that consists of many characters (many bytes), is replaced by a single character (i.e., a one-byte code). The frequencies at which character strings having n characters (n=2, 3, . . . ) appear in the tentative entry word index are calculated using the so-called n-gram statistical analysis. The compression contribution value when a character string having n bytes is substituted with one byte code is acquired by multiplying the count at which the character string appears in the entry word index, and a byte difference (n−1). The individual steps in the flowchart in FIG. 8 will now be described in detail.

A first IF loop constituted by a conditional sentence (step S600), "Is there an unprocessed entry word?" is initiated to examine the n-gram statistics for the entire tentative entry word index.

In the first IF loop, initially, a differential character string of the first remaining entry word is read from the tentative entry word index, and is substituted into variable REST (step S602). Then, value 2 is substituted into N (step S604), and the processing is initiated for the 2-gram statistical analysis.

In the second IF loop constituted by a conditional sentence (step S606), "Is N equal to or smaller than the length of the REST character string?," the n-gram statistical analysis process is performed for the character string REST (step S608, described in detail later). When the n-gram statistical analysis process for N=2, i.e., the 2-gram statistical analysis process has been completed, N is incremented by one (step S610), and the same IF loop processing (i.e., the (N+1)-gram statistical analysis process) is repeated.

When N exceeds the length of the character string REST, it is assumed that the n-gram statistical analysis process for the character string REST has been terminated, and at branch "No" of the decision block S606, program control exits the second IF loop and returns to step S600.

At step S600, the acquisition of a differential character string for the next entry word in the tentative entry word index is attempted. If the n-gram statistical analysis process is terminated for all the entry words in the tentative entry word index, program control exists the first IF loop at branch "No" of decision block S600. The termination of the first IF loop represents the completion of the collection of the n-gram statistic data. At this time, a tentative n-gram statistic table is generated.

Then, a compression contribution value when each character string having n bytes in the statistics data is replaced with a one byte code is calculated (step S620). Sequentially, the entries in the statistic table are sorted in the descending order of their compression contribution values (step S622).

As is described above, a compression contribution value is acquired by multiplying the frequency count and a difference of bytes (n−1).

At step S624, overlaps in the statistics are removed. An overlap in the statistics is, for example, where for a long character string "ABCD," the frequency counts for shorter character strings "ABC," "BCD," "AB," "BC" and "CD," which are included in "ABCD," are obtained by overlapping the frequency count of the string "ABCD." Since the longer character string has a greater compression contribution value, the long character string should remain in the statistic table. Therefore, the frequency count for the character string "ABCD" must be subtracted from the frequency counts in the individual entries for the short character strings "ABC," "BCD," "BC," "BC" and "CD."

After the overlaps of the statistics are removed at step S624, the entries in the statistic table are sorted again in accordance with the descending order of the compression contribution values (step S626).

Table 7 shows a statistic table obtained by sorting the entries in accordance with their compression contribution values. This is the result obtained by processing the entry word index data in a system dictionary included in the "King of Translation."

TABLE 7

| Entry No. | Chara. strg. | Frequency count | Compress value | Entry No. | Chara. strg. | Frequency count | Compress value | Entry No. | Chara. strg. | Frequency Count | Compress value |
|---|---|---|---|---|---|---|---|---|---|---|---|
| #001 | ness | 3054 | 9162 | #071 | one | 189 | 378 | #141 | ble | 137 | 274 |
| #002 | ly | 3745 | 3745 | #072 | ot | 372 | 372 | #142 | out | 137 | 274 |
| #003 | ing | 1625 | 3250 | #073 | sa | 372 | 372 | #143 | tive | 91 | 273 |
| #004 | tion | 1032 | 3096 | #074 | st | 372 | 372 | #144 | re | 271 | 271 |
| #005 | able | 762 | 2286 | #075 | ver | 183 | 366 | #145 | om | 266 | 266 |
| #006 | ion | 942 | 1884 | #076 | ical | 121 | 363 | #146 | ber | 133 | 266 |
| #007 | atio | 617 | 1851 | #077 | ingly | 90 | 360 | #147 | ir | 264 | 264 |
| #008 | le | 1702 | 1702 | #078 | izat | 119 | 357 | #148 | bo | 263 | 263 |
| #009 | ability | 265 | 1590 | #079 | per | 178 | 356 | #149 | is | 263 | 263 |
| #010 | ed | 1559 | 1559 | #080 | di | 352 | 352 | #150 | ci | 262 | 262 |
| #011 | ment | 518 | 1554 | #081 | ta | 352 | 352 | #151 | ded | 131 | 262 |
| #012 | lity | 505 | 1515 | #082 | her | 176 | 352 | #152 | gra | 131 | 262 |
| #013 | er | 1489 | 1489 | #083 | oo | 350 | 350 | #153 | han | 131 | 262 |
| #014 | ilit | 496 | 1488 | #084 | ite | 174 | 348 | #154 | tr | 261 | 261 |
| #015 | bill | 491 | 1473 | #085 | ure | 174 | 348 | #155 | land | 87 | 261 |
| #016 | or | 1268 | 1268 | #086 | am | 346 | 346 | #156 | do | 260 | 260 |
| #017 | abil | 365 | 1095 | #087 | ia | 346 | 346 | #157 | table | 65 | 260 |
| #018 | al | 1005 | 1005 | #088 | ibil | 115 | 345 | #158 | ger | 129 | 258 |
| #019 | loss | 332 | 996 | #089 | ster | 115 | 345 | #159 | ow | 255 | 255 |
| #020 | ally | 316 | 948 | #090 | ard | 170 | 340 | #160 | ai | 254 | 254 |
| #021 | ity | 458 | 916 | #091 | da | 339 | 339 | #161 | iti | 126 | 252 |
| #022 | ate | 457 | 914 | #092 | co | 338 | 338 | #162 | ral | 126 | 252 |
| #023 | ism | 456 | 912 | #093 | sion | 112 | 336 | #163 | ke | 250 | 250 |
| #024 | man | 448 | 896 | #094 | ha | 335 | 335 | #164 | wa | 249 | 249 |
| #025 | en | 838 | 838 | #095 | ina | 165 | 330 | #165 | head | 83 | 249 |
| #026 | ter | 418 | 836 | #096 | pe | 329 | 329 | #166 | sc | 248 | 248 |
| #027 | zati | 278 | 834 | #097 | os | 326 | 326 | #167 | ker | 124 | 248 |
| #028 | zation | 159 | 795 | #098 | nce | 163 | 326 | #168 | ran | 123 | 246 |
| #029 | ous | 377 | 754 | #099 | hi | 325 | 325 | #169 | va | 244 | 244 |
| #030 | ily | 367 | 734 | #100 | nt | 325 | 325 | #170 | nal | 122 | 244 |
| #031 | ve | 711 | 711 | #101 | late | 108 | 324 | #171 | meter | 61 | 244 |
| #032 | ines | 237 | 711 | #102 | um | 322 | 322 | #172 | so | 242 | 242 |
| #033 | tic | 345 | 690 | #103 | ide | 161 | 322 | #173 | che | 121 | 242 |
| #034 | ist | 341 | 682 | #104 | olog | 107 | 321 | #174 | ress | 80 | 240 |
| #035 | ence | 221 | 663 | #105 | rate | 107 | 321 | #175 | ain | 119 | 238 |
| #036 | iness | 160 | 840 | #106 | ze | 318 | 318 | #176 | ary | 119 | 238 |
| #037 | ie | 639 | 639 | #107 | rt | 317 | 317 | #177 | ere | 119 | 238 |
| #038 | ance | 206 | 618 | #108 | eil | 158 | 316 | #178 | ock | 119 | 238 |
| #039 | ro | 611 | 611 | #109 | as | 314 | 314 | #179 | po | 236 | 236 |
| #040 | se | 602 | 602 | #110 | line | 104 | 312 | #180 | eri | 117 | 234 |
| #041 | ian | 293 | 586 | #111 | pa | 310 | 310 | #181 | tan | 117 | 234 |
| #042 | ted | 276 | 552 | #112 | the | 155 | 310 | #182 | ouse | 78 | 234 |
| #043 | ibility | 90 | 540 | #113 | catl | 103 | 309 | #183 | rian | 78 | 234 |
| #044 | ch | 522 | 522 | #114 | red | 154 | 308 | #184 | ut | 233 | 233 |
| #045 | ial | 259 | 518 | #115 | ld | 306 | 306 | #185 | cti | 116 | 232 |

TABLE 7-continued

| Entry No. | Chara. strg. | Frequency count | Compress value | Entry No. | Chara. strg. | Frequency count | Compress value | Entry No. | Chara. strg. | Frequency Count | Compress value |
|---|---|---|---|---|---|---|---|---|---|---|---|
| #046 | age | 258 | 516 | #116 | logi | 102 | 306 | #186 | tal | 116 | 232 |
| #047 | ish | 258 | 516 | #117 | la | 302 | 302 | #187 | ification | 29 | 232 |
| #048 | th | 456 | 456 | #118 | ace | 150 | 300 | #188 | kin | 114 | 228 |
| #049 | ization | 76 | 456 | #119 | ari | 150 | 300 | #189 | card | 76 | 228 |
| #050 | el | 455 | 455 | #120 | tte | 150 | 300 | #190 | house | 57 | 228 |
| #051 | ol | 443 | 443 | #121 | ric | 148 | 296 | #191 | ast | 113 | 226 |
| #052 | ge | 430 | 430 | #122 | ect | 146 | 292 | #192 | est | 113 | 226 |
| #053 | ic | 430 | 430 | #123 | era | 146 | 292 | #193 | nic | 113 | 226 |
| #054 | ful | 215 | 430 | #124 | icat | 97 | 291 | #194 | rac | 113 | 226 |
| #055 | ee | 415 | 415 | #125 | ba | 289 | 289 | #195 | wor | 113 | 226 |
| #056 | ur | 415 | 415 | #126 | to | 287 | 287 | #196 | eter | 75 | 225 |
| #057 | ent | 207 | 414 | #127 | ear | 143 | 286 | #197 | no | 223 | 223 |
| #058 | ship | 138 | 414 | #128 | nde | 143 | 286 | #198 | ff | 222 | 222 |
| #059 | et | 408 | 408 | #129 | na | 284 | 284 | #199 | mo | 222 | 222 |
| #060 | and | 202 | 404 | #130 | ton | 141 | 282 | #200 | up | 221 | 221 |
| #061 | ho | 401 | 401 | #131 | ngly | 94 | 282 | | | | |
| #062 | ry | 400 | 400 | #132 | tabl | 94 | 282 | total | | | 108221 |
| #063 | der | 200 | 400 | #133 | ill | 140 | 280 | | | | |
| #064 | ious | 132 | 396 | #134 | ome | 140 | 280 | | | | |
| #065 | ight | 131 | 393 | #135 | und | 140 | 280 | | | | |
| #066 | ma | 392 | 392 | #136 | ga | 279 | 279 | | | | |
| #067 | sh | 384 | 384 | #137 | op | 278 | 278 | | | | |
| #068 | ni | 383 | 383 | #138 | min | 139 | 278 | | | | |
| #069 | si | 380 | 380 | #139 | ingl | 92 | 276 | | | | |
| #070 | ant | 189 | 378 | #140 | ade | 137 | 274 | | | | |

As is apparent from Table 7, the compression contribution value 9162 for character string "ness," which is the first entry, is the highest, and compression contribution value 3745 for character string "ly" is the second highest.

Figure 9:
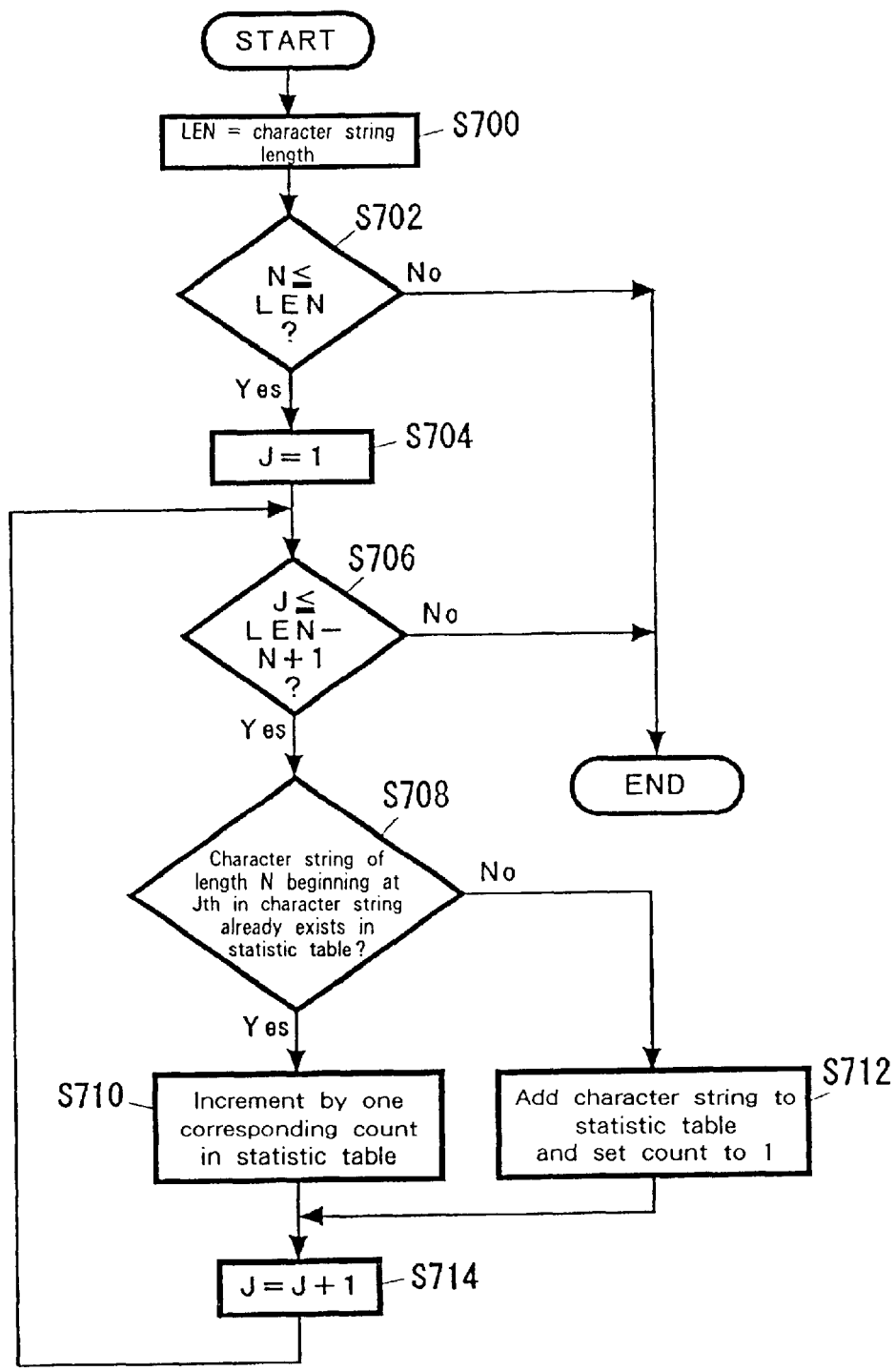
FIG. 9 is a detailed flowchart showing the n-gram statistical analysis process routine at step S608 (second embodiment).

FIG. 9 is a detailed flowchart showing the n-gram statistical analysis process routine at step S608. The individual steps will now be described.

At step S700, the length of a differential character string for an entry word being processed (i.e., it is substituted into the variable REST) is substituted into variable LEN. At step S702 a check is performed to determine whether N is equal to or smaller than LEN. When N exceeds LEN, the n-gram statistical analysis process is not required (there are no n-gram statistics for character strings having (N-1) characters, for example). Program control exits at branch "No" at decision block S702 and the process routine is terminated. When N is equal to or smaller than LEN, program control branches to "Yes" and the following process is performed.

At step S704 a value of 1 is substituted into variable J. The variable J is a variable for designating a character string segment that consists of the Jth and the following characters of the character string REST.

In the IF loop constituted by a conditional sentence (S706), "Is J equal to or smaller than LEN-N+1,1" the n-gram statistic analysis is conducted for character strings having N characters, which are included in the character string segment consisting of the Jth and following characters of the character string REST in the process. When J exceeds LEN-N+1, no character strings having N or more characters remain in the segment consisting of Jth and following characters of the character string REST. Program control exits at branch "No" at decision block S706 and the process routine is terminated. When J is equal to or smaller than LEN-N+1, the following step is performed.

At step S708 a check is performed to determine whether a character string having N characters beginning with the Jth character of the character string REST already exists in the statistic table. If REST="ABCD," and J=2 and N=2, a check is performed to determine whether character string BC, which consists of two characters beginning with the second character of the character string ABCD, is present in the statistic table. If a corresponding entry exists in the statistic table, the frequency count of the entry is incremented by one (step S710). When no such entry is found in the statistic table, a new entry is added and its frequency count is set to 1 (step S712).

The n-gram statistical analysis has been conducted for a character string having N characters beginning at the Jth character of the character string REST, and J is incremented by one (step S714). Program control then returns to step S706 to repeat the n-gram statistical analysis for a character string having N bytes beginning at the (J+1)th character.

Generation of character translation code table:

After the statistic table has been prepared in which entries are arranged in accordance with the descending order of their compression contribution values in the process routine in FIGS. 8 and 9, a character code translation table for replacing a character string with code is generated. To embody the present invention, a new table for translating characters into code may be designed. In this embodiment, an ASCII (American Standard Code for Information Interchange) code table is employed that is well known and widely used as a table for assigning alphanumerical characters to code, and unused columns in this code table are newly assigned for character strings having high compression contribution values. The advantage of the employment of the ASCII code table is that conventional code can be used unchanged for regular alphanumerical characters, such as a, b, c, . . . and 0, 1, 2, . . . . The ASCII code table conforms to the specifications established by ANSI (American National Standards Institute).

Figure 10:
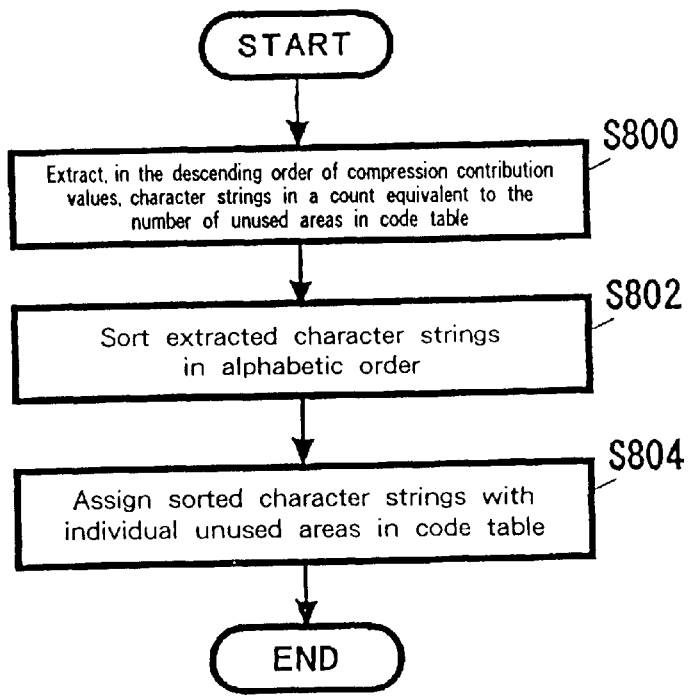
FIG. 10 is a flowchart showing a process routine for generating a new character translation code table in accordance with the compression contribution values provided by the n-gram statistical analysis processing (second embodiment).

FIG. 10 is a flowchart showing a process routine for generating a new character translation code table in accordance with compression contribution values obtained in the n-gram statistical analysis process. The individual steps will now be explained.

First, character strings in a count equivalent to the number of unused areas in the character translation code table are extracted from the high ranks of the statistic table (step S800). When the ASCII code table is used as the character translation code table, there are 185 unused columns (a case where English capital letters are not used), and only 185 highly ranked entries in the statistic table need be acquired.

Then, the obtained character strings are sorted in alphabetical order (step S802). Each of the sorted character strings is assigned a position, beginning with the first unused area of the character translation code table (step S804). The character strings are assigned positions in alphabetical order because this facilitates the performance of a following dictionary search process, which will be described later.

Table 8 shows a character translation code table prepared during the process routine in FIG. 10. The table is based on the ASCII code table, and conventional codes are assigned unchanged for regular alphanumerical characters, such as a, b, c . . . and 0, 1, 2, . . . (in Table 8, the conventional column assignments in the ASCII code table displayed are enclosed in frames). A character string "abil" having a high compression contribution value is assigned for unused column 0x01 in the ASCII code table, and character string "ouse" is assigned for unused column 0xc9 in the table.

character count is defined as a reference entry word (step S902). The "reference entry word" is an entry word for which the compression process for a differential character string is not performed and for which the original character string is registered unchanged in the dictionary entry word index. The matching character count for the entry word is reset to 0. The thus defined "reference entry word" is used when examining a dictionary to find a word. For details of this operation see sub-division D-2, which will be described later.

Following this, the original entry word character string for the first entry is extracted from the tentative entry word index, and is substituted into a variable STR (step S904). The first IF loop, constituted by the conditional sentence, "Is variable STR empty?," initiates the compression process for the entire tentative entry word index.

At step S908, a check is performed to determine whether the acquired entry word is a reference entry word. Whether or not the character string is a reference entry word is determined by ascertaining whether a matching character count M in the entry is 0. If the obtained entry word is a

TABLE 8

|  | 00 | 01 | 02 | 03 | 04 | 05 | 06 | 07 | 08 | 09 | 0a | 0b | 0c | 0d | 0e | 0f |
| --- | --- | --- | --- | --- | --- | --- | --- | --- | --- | --- | --- | --- | --- | --- | --- | --- |
| 0 × 00 | (null) | abil | ability | able | ace | ade | age | ai | ain | al | ally | am | ance | and | ant | ard |
| 0 × 10 | ari | ary | as | ate | atio | ba | ber | bili | ble | bo | cati | ch | che | ci | co | da |
| 0 × 20 | (space) | ! | " | # | $ | % | & | ' | ( | ) | * | + | , | - | . | / |
| 0 × 30 | 0 | 1 | 2 | 3 | 4 | 5 | 6 | 7 | 8 | 9 | : | ; | < | = | > | ? |
| 0 × 40 | @ | ded | der | di | do | esr | ect | ed | ee | ei | eii | en | ence | ent | er | era |
| 0 × 50 | ere | eri | et | fication |  | ful | gs | ge | ger | gra | ha |  |  |  | han |  |
| 0 × 60 | ' | a | b | c | d | e | f | g | h | i | j | k | l | m | n | o |
| 0 × 70 | p | q | r | s | t | u | v | w | x | y | z |  |  |  |  |  |
| 0 × 80 | head | her | hi | ho | ia | ial | ian | ibil | ibility | ic | ical | icat | id | ide | ie | ight |
| 0 × 90 | ilit | ill | ily | ina | ines | iness | ing | ingl | ingly | ion | ious | ir | is | ish | isul | ist |
| 0 × a0 | ite | iti | ity | izat | ization | ke | ker | la | land | late | le | less | line | lity | logi | ly |
| 0 × b0 | ma | man | ment | meter | min | na | nal | nce | nde | ness | ngly | ni | nt | ock | ol | olog |
| 0 × c0 | om | ome | one | oo | op | or | os | ot | ous | ouse | out | ow | pa | pe | per | po |
| 0 × d0 | ral | ran | rate | re | red | ress | rian | ric | ro | rt | ry | sa | sc | se | sh | ship |
| 0 × e0 | si | sion | so | st | ster | ta | tabl | table | tan | ted | ter | th | the | tic | tion | tive |
| 0 × f0 | to | ton | tr | tte | um | und | ur | ure | ut | va | ve | ver | wa | zati | zation | ze |

It should be noted that Table 8 shows the results obtained by processing the previously described entry word index data in a system dictionary included in the "King of Translation."

Generation of dictionary entry word index:

When a new character translation code table is prepared, this is employed to generate a new dictionary entry word index. In Table 8 representing character translation code, a character string having n characters, i.e., n bytes (n is an integer greater than 1) is replaced with a one-byte code (previously described). Among the entry words, since a character string of n bytes that has a high compression contribution value is replaced by one byte code in accordance with the character translation code table, a compression effect of (n−1) bytes can be provided by preparing a new entry word index.

Figure 11:
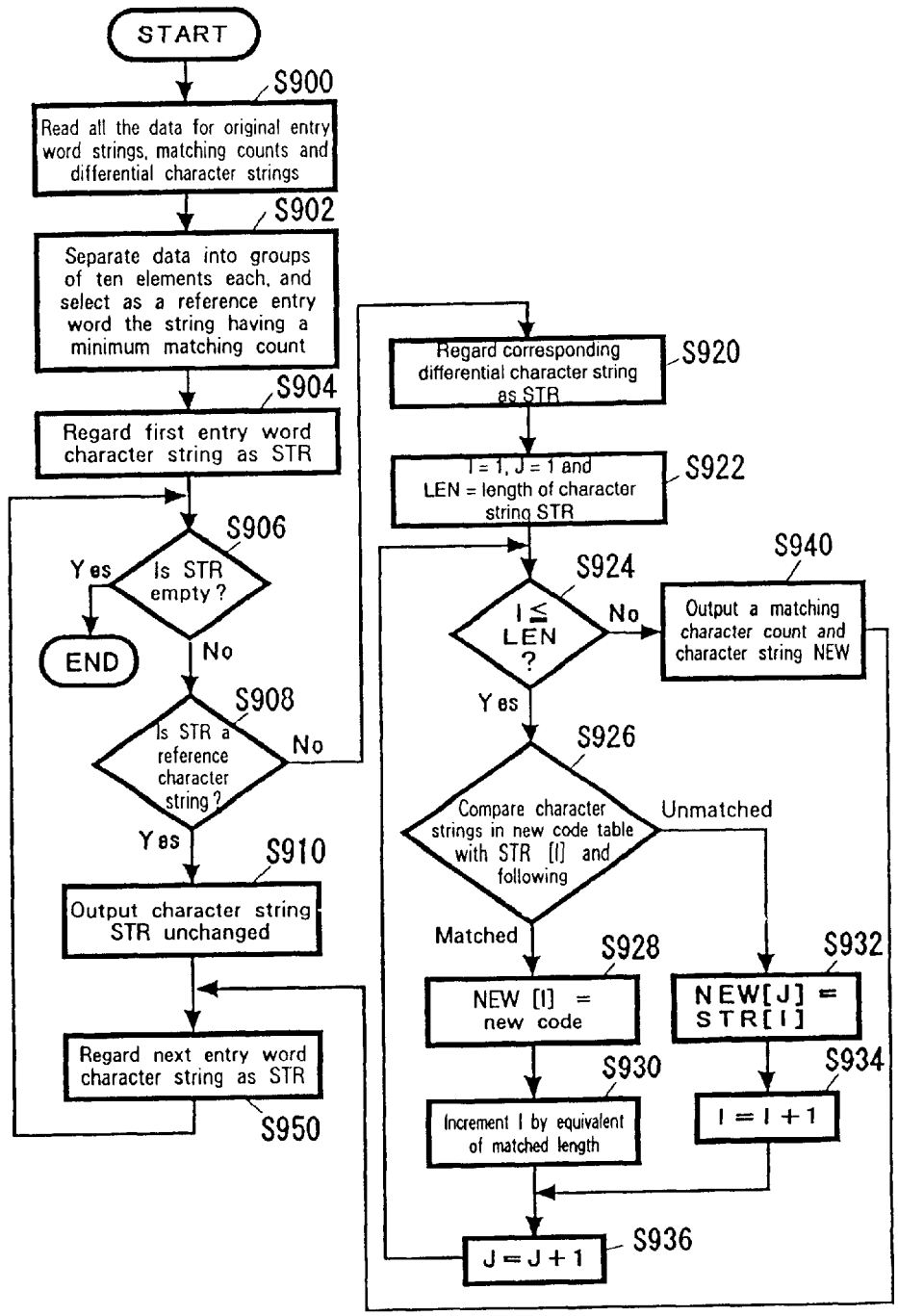
FIG. 11 is a flowchart showing a process routine for generating a dictionary entry word index (second embodiment).

FIG. 11 is a flowchart showing the process routine for generating a dictionary entry word index from the tentative entry word index. The individual steps will now be explained.

First, at step S900 all the contents at the tentative entry word index (see Table 6), i.e., the original entry word character strings for individual entries in the index, matching character counts and differential character strings are read.

Then, the read data are arranged in ten entry groups, and for each group, the entry word that has the smallest matching reference entry word, it is not compressed and the original character string is registered unchanged. Program control branches to "Yes" at decision block S908, and the character string STR is output unchanged as a dictionary entry word index. Then, the original entry word in the succeeding entry is extracted from the tentative entry word index, and is substituted into the variable STR (step S950). Program control thereafter returns to step S906.

If the obtained entry word is not a reference entry word, its differential character string is compressed. In this case, first, a differential character string of an entry word is substituted into the variable STR (step S920). If the obtained entry word is "abhorrence," differential character string "rence" is substituted into the variable STR (see Table 6). The initial value 1 is set in the variables I and J, and the length of the differential character string STR is set as the value in the variable LEN (step S922).

In the second IF loop, constituted by the conditional sentence (step S924), "Is I equal to or smaller than LEN," the compression process for the differential character string STR is performed. In the compression process, the individual character string segments of the differential character string STR are replaced by codes from the character translation code table.

First, a character string segment that consists of the Ith and the following characters of the differential character string STR is compared with each character string in the character translation code table shown as Table 8 (step S926). This comparison is performed in the reverse direction, starting at the last entry in the character translation code table. Since character strings are assigned in the character translation code table in alphabetic order (see Table 8), the table is searched in the reverse direction so that character string having more characters can be examined first in the comparison process. When, for example, a character string segment "lity" exists at the Ith and the following characters of the differential character string STR, "lit" and "lity" are selected as candidate matching character strings in the Table 8, and the character string segment is first compared with "lity," which appears later in the alphabet order (i.e., has more characters).

If a character string that matches the character string segment that consists of the Ith and the following characters of the differential character string STR is found in the character translation code table, the matching code is substituted into the Jth character of a new character string NEW (step S928), and the variable I is incremented by a number equivalent to the number of characters of this matching character string (step S930). For example, when the segment that consists of the Ith and the following characters of the string STR includes a 4-byte character string "ness," the character string segment is replaced by a one-byte character "b9," in accordance with the character translation code table. At this time, the variable I is incremented by four.

If in the code table there is no character string that matches the character string segment that consists of the Ith and the following characters of the differential character string STR, the Ith character of the original character string STR is substituted into the Jth character string of the new character string NEW (step S932), and the variable I is incremented by one (step S934).

After a matching code, or one character of the original string, is substituted into the Jth character of the new character string NEW, and the variable J is incremented by one (step S936), program control returns to step S924 to repeat the above described IF loop processing. When the variable I exceeds the character string length LEN, it means that the process for translating the differential character string STR into the new character string NEW has been terminated. Program control exits the second IF loop at branch "No" at decision block S924, and coded character string NEW is output as an entry word in the dictionary entry word index (step S940). The original entry word of the next entry is extracted from the tentative entry word index and is substituted into the variable STR (step S950). Program control thereafter returns to step S906.

At step S906, a check is performed to determine whether unprocessed entry words remain in the tentative entry word index. If so, the above described process is repeated for the remaining entry words. If there is no unprocessed entry word, it is assumed that the entire entry word index has been processed. Program control thereafter exits the routine at branch "No" at decision block S906, and the processing routine is terminated.

Table 9 shows one part of a dictionary entry word index that is generated by the processing routine in FIG. 11 in addition to data concerning the original entry words. Each entry in the dictionary entry word index need have only two fields (up to the second column from the left in the table) for entering a matching character count and differential character string code, and there is no necessity to include a matching character string or a differential character string, or the original character string.

TABLE 9

| | Coded differential character string | Matching character string | Differential character string | Original character string |
|---|---|---|---|---|
| 00 | 61 2d 62 6f 6d 62 | | a-b o m b | a-bomb |
| 02 | 63 61 70 cd 6c a7 | a- | c a p pe l la | a-cappella |
| 02 | 64 65 75 78 | a- | d e u x | a-deux |
| 02 | 66 6f te 64 | a- | f o n d | a-fond |
| 04 | d9 69 c5 69 | a-fo | rt i or i | a-fortiori |
| 02 | a7 2d 63 61 d9 55 | a- | la - c a rt e | a-la-carte |
| 05 | 6b 96 | a-la- | k ing | a-la-king |
| 05 | 6d 61 64 65 | a-la- | m o d e | a-la-mode |
| 03 | 65 fe 6c | a-l | a ve l | a-level |
| 02 | 5e 14 16 | a- | n um ber | a-number |
| 02 | cf e4 69 c5 69 | a- | po ster i or i | a-posteriori |
| 03 | 72 69 c5 69 | a-p | r i or i | a-priori |
| 02 | 74 65 6d cf | a- | t e m po | a-tempo |
| 00 | 61 2e 63 2e | | a. c. | a.c. |
| 02 | 6d 2e | a. | a. | a.w. |
| 02 | 77 2e 6f ea 6c 2a | a. | w. o. l. | a.w.o.l. |
| 01 | 2f 63 | a | /c | a/c |
| 01 | 62 2d 59 bb 74 69 6f | a | b - i ni t i o | ab-initio |
| 02 | 2e | ab | . | ab. |
| 00 | 61 62 61 63 69 | | a b a c i | abaci |
| 04 | 6b | abac | k | aback |
| 04 | 7573 | abac | u s | abacus |
| 03 | 5c c2 | aba | l one | abalone |
| 03 | dd | aba | n do n | abandon |
| 07 | 47 | abandon | ad | abandoned |
| 08 | 72 | abandone | r | abandoner |
| 07 | b2 | abandon | ment | abandonment |
| 03 | dd | aba | se | abase |
| 04 | 68 | abas | h | abash |
| 05 | 47 | abash | ed | abashed |
| 05 | b2 | | | |
| 00 | 61 62 61 74 61 62 6c 65 | | a b a t a b l e | abatable |
| 04 | 65 | abat | e | abate |

TABLE 9-continued

| Coded differential character string | Matching character string | Differential character string | Original character string |
|---|---|---|---|
| 05 62 | abate | ment | abatement |
| 04 9c | abat | is | abatis |
| 04 74 9c | abat | t is | abattis |
| 05 5f 9b | abatt | o ir | abattoir |
| 00 61 62 63 79 | | a b b a c y | abbacy |
| 04 74 85 | abba | t ial | abbatial |
| 03 65 73 73 | abb | e s s | abbess |
| 04 79 | abbe | y | abbey |
| 03 c7 | abb | ot | abbot |
| 03 72 2e | abb | r . | abbr. |
| 04 65 76 2e | abbr | e v . | abbrev. |
| 06 84 74 65 | abbrev | ia t e | abbreviate |
| 09 99 | abbreviat | ion | abbreviation |
| 09 c5 | abbreviat | or | abbreviator |
| 00 61 62 64 69 63 61 62 6c 65 | | a b d i c a b l e | abdicable |
| 06 74 65 | abdica | t e | abdicate |
| 07 99 | abdicat | ion | abdication |
| 07 c5 | abdicat | or | abdicator |
| 03 c1 6e | abd | ome n | abdomen |
| 05 93 6c | abdom | ina l | abdominal |
| 09 cf | abdominal | ly | abdominally |
| 03 75 63 74 | abd | u c t | abduct |
| 06 99 | abduct | ion | abduction |
| 06 c5 | abduct | or | abductor |
| 00 61 62 65 61 6d | | a b e a m | abeam |
| 03 63 47 10 61 6e | abe | c ed ari a n | abecedarian |
| 03 64 | abe | d | abed |
| 03 aa | abe | le | abele |
| 03 72 d1 63 65 | abe | r ran c e | aberrance |
| 08 79 | aberranc | y | aberrancy |
| 07 74 | aberran | t | aberrant |
| 08 af | aberrant | ly | aberrantly |
| 06 ee | aberra | tion | aberration |
| 0a 09 | aberration | al | aberrational |
| 03 74 | abe | t | abet |
| 04 62 | abet | ment | abetment |
| 04 ap | abet | ter | abetter |
| 05 c5 | abett | or | abettor |
| 03 79 Dc | abe | y ance | abeyance |
| 06 74 | abeyan | t | abeyant |
| 00 61 62 58 6f 72 | | a b h o r | abhor |
| 05 d3 67 | abhor | re nce | abhorrence |
| 08 74 | abhorren | t | abhorrent |
| 09 ef | abhorrent | ly | abhorrently |
| 07 72 | abhorre | r | abhorrer |
| 00 61 62 69 61 5e 63 65 | | a b i d a n c e | abidance |
| 04 65 | abid | e | abide |
| 05 72 | abide | r | abider |
| 04 96 | abid | ing | abiding |
| 03 5c a1 65 73 | abi | lities | abilities |
| 06 79 | abilit | y | ability |
| 02 6a 46 | ab | j ect | abject |
| 06 99 | abject | ion | abjection |
| 06 af | abject | ly | abjectly |
| 06 b9 | abject | ness | abjectness |
| 03 f6 14 6e | abj | ur ation | abjuration |
| 05 65 | abjur | e | abjure |
| 06 72 | abjure | r | abjurer |
| 00 61 62 6c 74 65 | | a b l a t e | ablate |
| 05 99 | ablat | ion | ablation |
| 06 fa | ablati | ve | ablative |
| 04 f8 | abla | ut | ablaut |
| 04 ff | abla | ze | ablaze |
| 03 65 | abl | e | able |

*Matching character count

As is apparent from Table 9, the original entry word "abhorrence" of ten characters, i.e., ten bytes, is replaced by the three byte code "05 d3 b7." In other words, a compression effect of 7 (=10−3) bytes can be provided for this entry word.

As an experimental result, when the compression method in this embodiment was applied for the entry word index of the system dictionary for the "King of Translation," the original entry word index of 625 Kbytes was compressed to a length of 315 Kbytes. When the amount of entry word index data is small they can be made resident in the main memory 14 of the computer system 100, without being exchanged (swapped out). Since the access speed for memory-resident data is high, an increase in the dictionary search speed is obtained. Especially for a machine translation system that prepares some dictionaries, the compression of data to reduce its size is very effective when it is desired to make the entry word index data memory resident.

The compression process for the dictionary entry word index data according to the first and the second embodiments, which have been described in detail in sub-division C, can be implemented when, for example, the computer system 100 in FIG. 1 performs a computer program that includes for each embodiment a compression processing routine.

D. Machine translation using a compressed entry word index

In this sub-division, machine translation processing using a compressed entry word index will now be described. The machine translation processing is implemented by performing on the computer system 100 a machine translation program that was explained in sub-division A. In the following explanation, it is assumed that one character is one byte.

Figure 12:
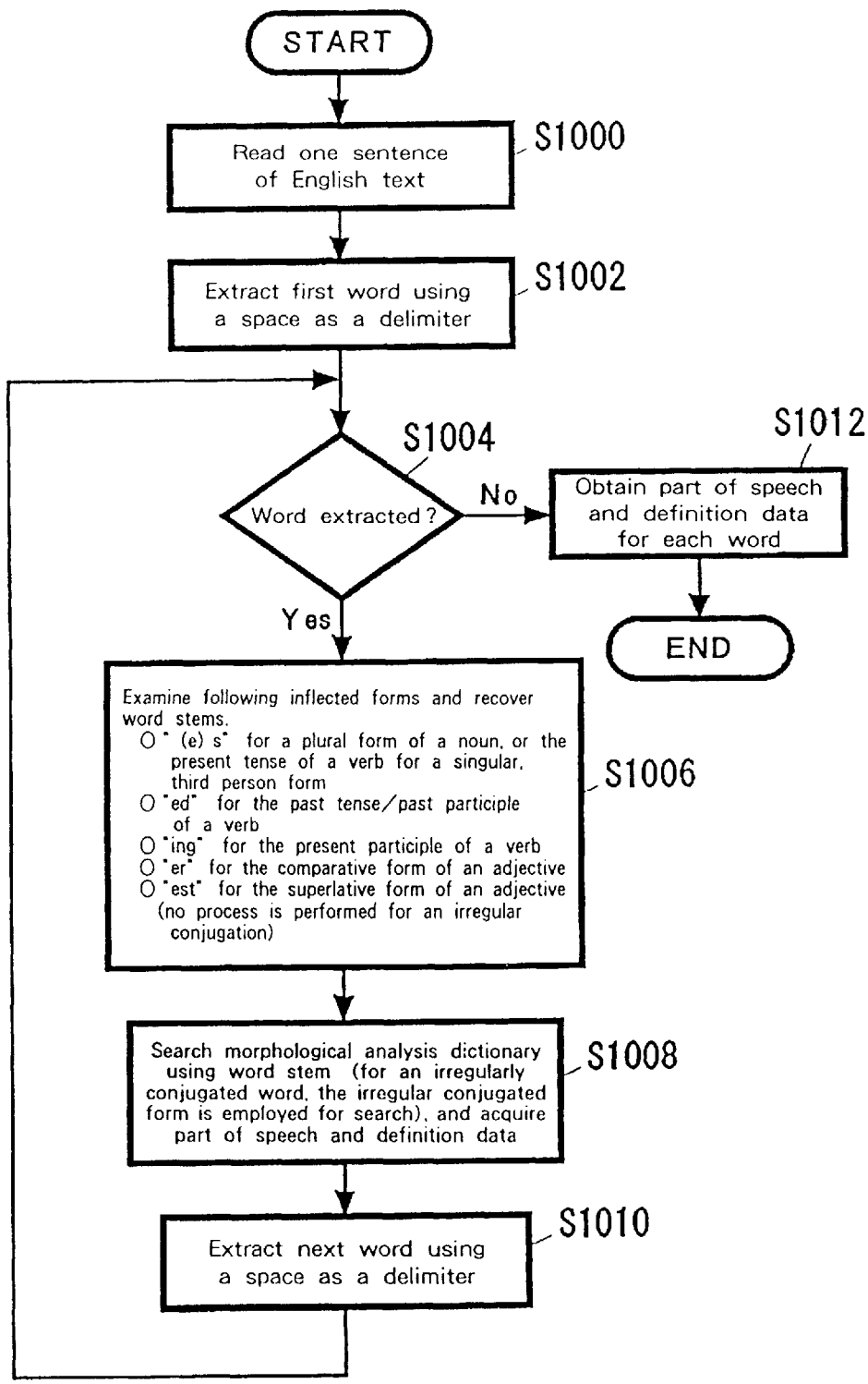
FIG. 12 is a flowchart showing a morphological analysis operation for machine translation.

In machine translation processing, generally, original text (English text in this case) is read for each sentence, and each word in the sentence is extracted and morphological analysis of the word is performed. FIG. 12 is a flowchart showing a morphological analysis operation. The individual steps will now be explained.

First, at step S1000 one sentence is read from the original text to be translated.

At step S1002, the first word is extracted, with a space being regarded as a separation. An IF loop, constituted by a conditional sentence (step S1004), "Has a word been extracted?," initiates the sequential morphological analysis process for the individual words included in the sentence that has been read.

In the IF loop, at step S1006 the conjugated or inflected form of a word is examined to recover the base form. Conjugation and inflection include the following:
1) "(e)s" for a plural form of a noun, or the present tense of a verb for a singular, third person form
2) "ed" for the past tense/past participle form of a verb
3) "ing" for the present participle form of a verb
4) "er" for the comparative form of an adjective
5) "est" for the superlative form of an adjective (no process is performed for an irregular conjugation.)

At step S1008 a word stem is searched for in the dictionary (for an irregularly conjugated word, the irregular conjugated form is employed for the search), and morphological analysis data, such as the part of speech and the definition, are acquired. The dictionary search is conducted in accordance with the procedures for performing search of the dictionary entry word index to find an entry word that corresponds to a word stem, and for acquiring morphological analysis data corresponding to that entry word.

As is described in sub-division C, the dictionary entry word index data are compressed, and are preferably resident in the main memory 14 of the computer system 100 during the machine translation processing. The dictionary search routine at step S1008 differs depending on which of the compression methods in the first and the second embodiment is employed for the compression of the entry word index. This will be explained in detail later.

When the morphological analysis data for the word are acquired, the succeeding word is extracted from the sentence (step S1010), and program control returns to step S1004.

When the above process routine is terminated for the entire sentence that was read, program control exits the IF loop at branch "No" at decision block S1004. At this time, since the part of speech and the definition data for each word in the sentence have been obtained (step S1012), the morphological analysis process for the sentence is terminated.

D-1. First embodiment

The first embodiment in this sub-division is a dictionary search process performed using an entry word index that is compressed using the compression method described in detail in sub-division C-1.

Figure 13:
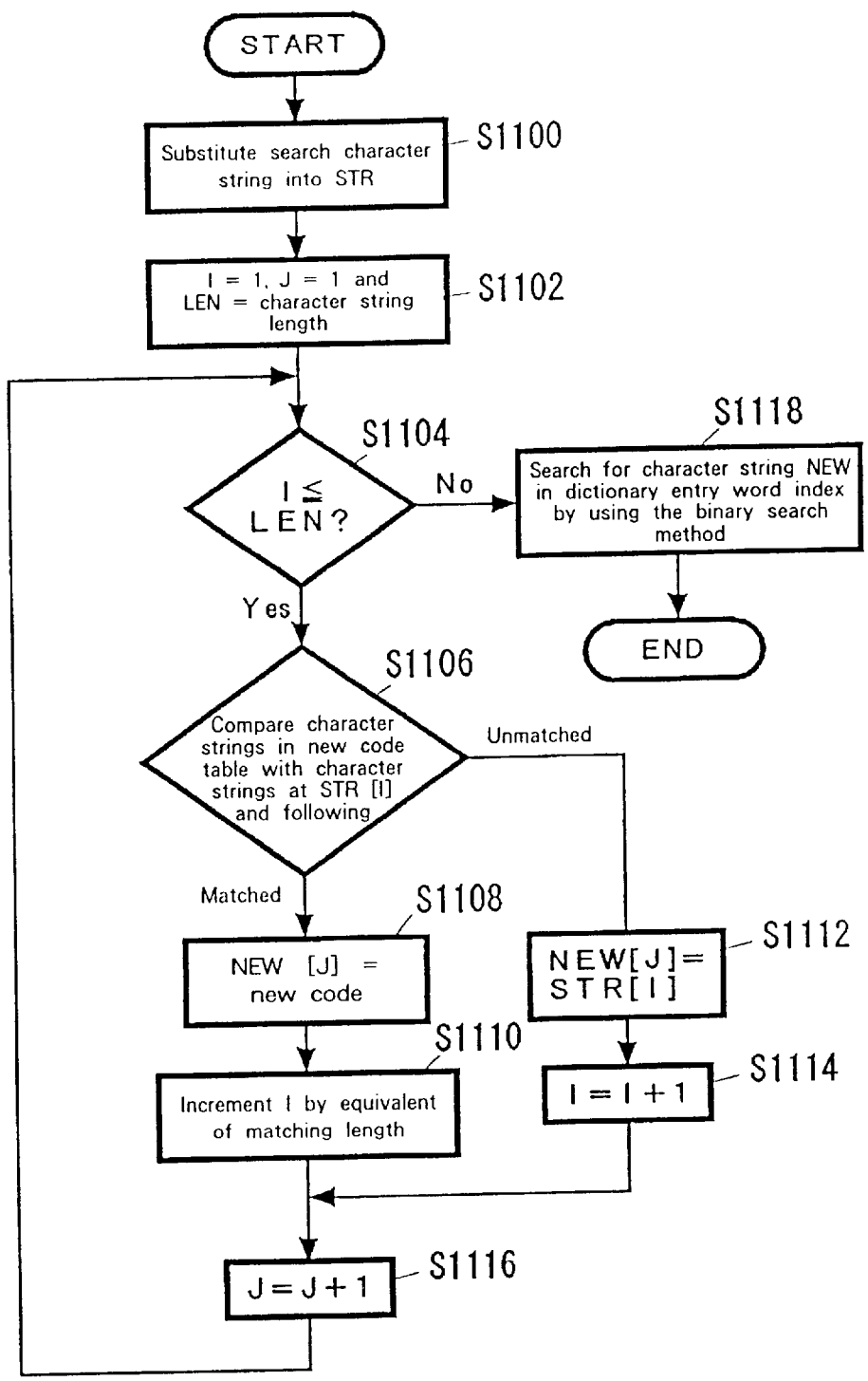
FIG. 13 is a flowchart for dictionary search processing (first embodiment).

FIG. 13 is a flowchart showing the dictionary search processing. The individual steps will now be described.

First, at step S1100 a character string to be searched for is substituted into the variable STR. The character string to be searched for corresponds to a word that is extracted at step S1002 or S1010 and is returned to its base form at step S1006.

An initial value of 1 is substituted into variables I and J, and the length of the character string STR is substituted into variable LEN (step S1102). The variable I is used to designate the Ith character of the original character string STR, and the variable J is used to designate the Jth character of a new character string NEW.

In the IF loop, constituted by the conditional sentence (step S1104), "Is I equal to or smaller than LEN," the compression process for the character string STR is performed in accordance with the character translation code in Table 4.

First, a character string segment that consists of the Ith and the following characters of the character string STR is compared with each character string in the character translation code table shown as Table 4 (step S1106). This comparison is performed in the reverse direction, starting at the last entry in the character translation code table. Since character strings are assigned in the character translation code table in alphabetic order, the table is searched in the reverse direction so that character string having more characters can be examined first in the comparison process. When, for example, a character string segment "lity" exists at the Ith and the following characters of the character string STR, "lit" and "lity" are selected as candidate matching character strings in the Table 4, and the character string segment is first compared with "lity," which appears later in the alphabet order (i.e., has more characters).

If a character string that matches the character string segment that consists of the Ith and the following characters of the character string STR is found in the character translation code table, the matching code is substituted into the Jth character of a new character string NEW (step S1108), and the variable I is incremented by a number equivalent to the number of characters of this matching character string (step S1110). For example, when the segment that consists of the Ith and the following characters of the string STR includes a 4-byte character string "ness," the character string segment is replaced by a one-byte character "b9," in accordance with the character translation code table. At this time, the variable I is incremented by four.

If in the code table there is no character string that matches the character string segment that consists of the Ith and the following characters of the character string STR, the Ith character of the original character string STR is substituted into the Jth character string of the new character string NEW (step S1112), and the variable I is incremented by one (step S1114).

After a matching code, or one character of the original string, is substituted into the Jth character of the new character string NEW, and the variable J is incremented by one (step S1116), program control returns to step S1104 to repeat the above described IF loop processing. When the variable I exceeds the character string length LEN, it means that the process for translating the original character string STR into the new character string NEW has been terminated. Program control exits the IF loop at branch "No" at decision block S1104.

At step S1118, the generated code NEW is searched for in the entry word index in Table 5. When, for example, the original word is "abandonment," the code NEW is "01 0c c3 af" and an entry word corresponding to this code need only be searched for in the entry word index. The binary search may be employed for this search. When an entry word exists in the entry word index, corresponding morphological analysis data are output, and the processing routine is terminated.

According to this dictionary search method, the recovery of the entry word index data is not required in order to search for the original entry word. Therefore, the decompression process is not required for the search conducted in the compressed entry word index, and the search speed is not deteriorated.

D-2. Second embodiment

The second embodiment in this sub-division is a dictionary search process that is performed using an entry word index compressed using the compression method described in detail in sub-division C-2.

Figure 14:
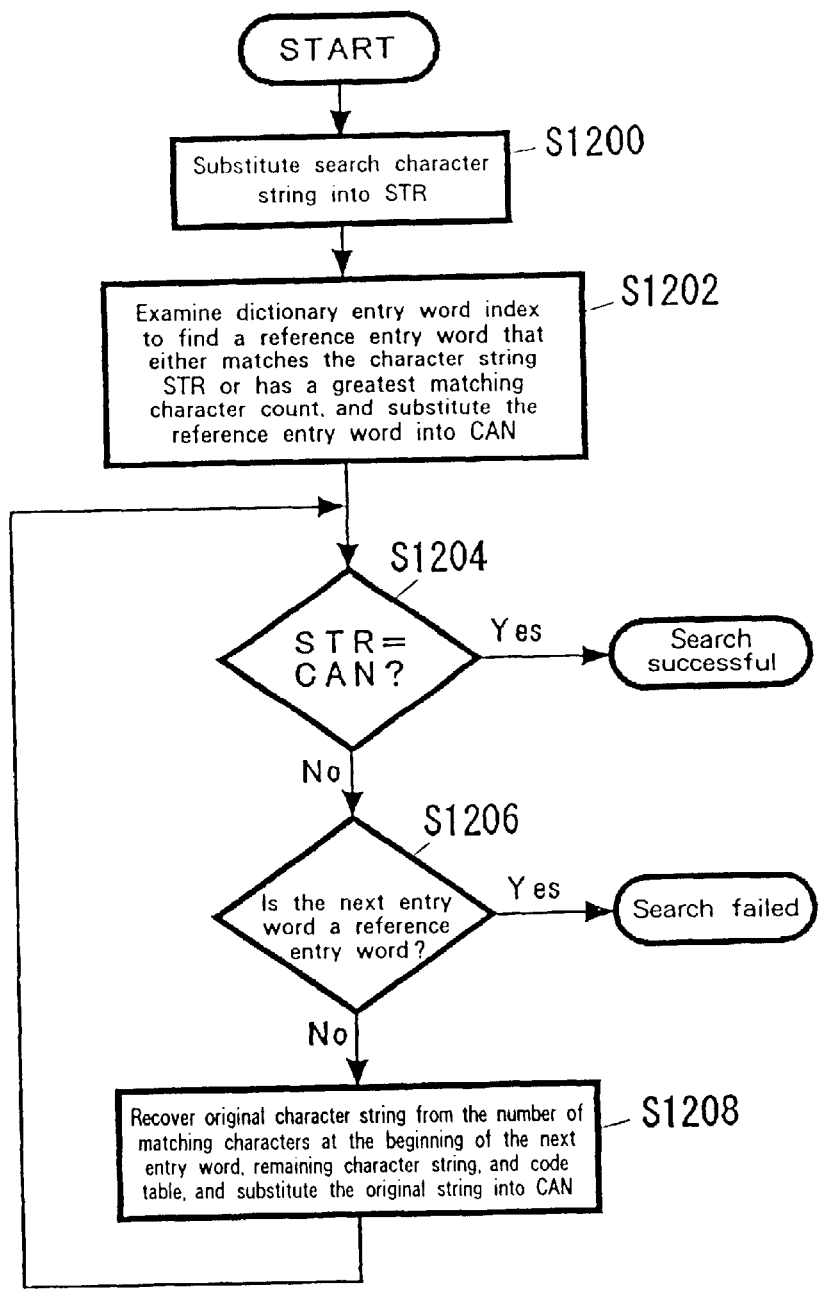
FIG. 14 is a flowchart for dictionary search processing (second embodiment).

FIG. 14 is a flowchart showing the dictionary search processing. The individual steps will now be described.

First, at step S1200 a character string to be searched for is substituted into the variable STR. The character string to be searched for corresponds to a word that is extracted at step S1002 or S1010 and is returned to its base form at step S1006.

At Step 71202, the dictionary entry word index in Table 9 is examined to find a reference entry word that either matches the character string STR or has a greatest matching character count.

The binary search may be employed for this search. The found reference entry word is substituted into a variable CAN as a candidate character string. When there are some reference entry words found that have the same matching character count, the entry word placed first in the alphabetic order is selected. When, for example, the character string STR is "abdication," the most similar reference entry word "abdicable" is substituted into the variable CAN as a candidate character string.

At step S1204, a check is performed to determine whether the search character string STR matches the candidate character string CAN. If the character string STR matches the character string CAN, it means that the dictionary search has been successful. Program control therefore exits the loop at branch "Yes" at decision block S1204, and the processing routine is terminated.

When the character string STR does not match the character string CAN, at step S1206 the entry word next to the candidate character string CAN is extracted and is examined to determine whether it is a reference character string. In the process routine in FIG. 14, when the search character string STR is not a reference character string, it is compared with each entry word in a descending order, beginning with the reference entry word that has the largest matching character count. If, for example, the search character string STR is "abdication," each entry word, "06 te," "07 ion," etc., is extracted in descending order beginning at the most similar reference entry word "abdicable," and is compared with the character string STR. When the candidate character string CAN does not match the search character string STR and the next reference entry word is reached, it is assumed that no entry word that corresponds to the search character string STR exists in the entry word index. In this case, program control exits the loop at branch "No" at decision block S1206, and the dictionary search process is terminated.

When the entry word next to the candidate character string CAN is not a reference character string, the original character string for this entry word is recovered (which will be described later), and is substituted into the candidate character string CAN (step S1208). Program control then returns to step S1204, and the comparison process relative to the character string STR is repeated.

Figure 15:
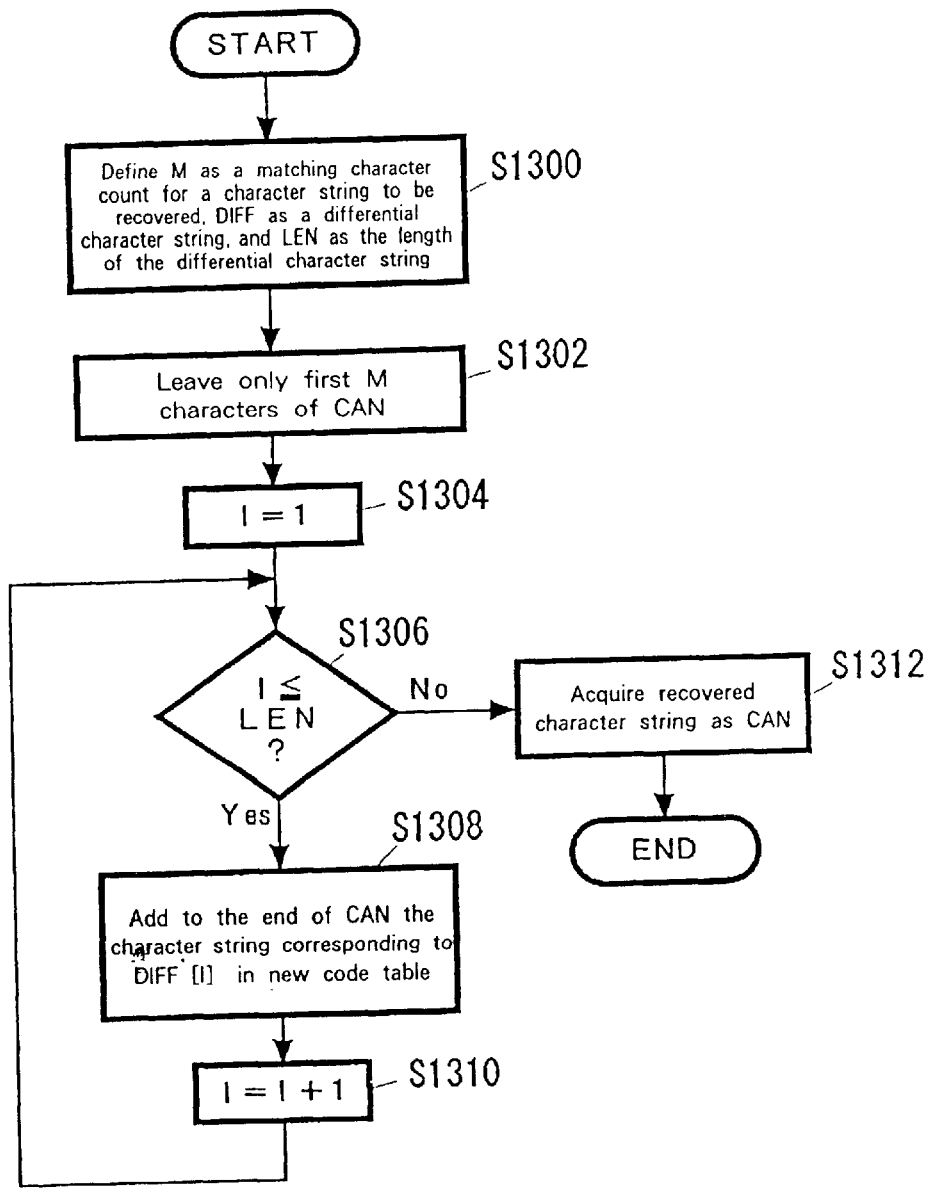
FIG. 15 is a flowchart for a character string recovery operation (second embodiment).

FIG. 15 is a flowchart showing the process (step S1208) for recovering a character string in the entry word index in Table 9 Fly that is not a reference entry word, i.e., the compressed entry word used to obtain the original entry word character string. The individual steps will now be described.

At step S1300, of an entry word character string to be recovered, a matching character count is substituted into a variable M, a differential character string is substituted into a variable DIFF, and the length of the differential character string (character count) is substituted into a variable LEN. The "entry word character string to be recovered" corresponds to an entry word succeeding the candidate character string CAN in the entry word index (see step S1206 in FIG. 14). When, for example, the candidate character string CAN is reference entry word "abhor," the succeeding entry word is "05 d3 b7" (see Table 9), and the variable values M=5, DIFF="d3 b7," and LEN=2 are set.

At step S1302 the first M characters of the candidate character string CAN remain, while the (M+1)th and following characters are eliminated. For example, when CAN= "abhor" and M=5, the resultant string CAN="abhor."

At step S1304 an initial value of 1 is substituted into a variable I.

In the IF loop constituted by a conditional sentence, "Is I equal to or smaller than LEN?," the process is repeated for recovering the original character strings from individual codes in the variable DIFF, while referring to the character translation code table in Table 8. At step S1308 the original character string is recovered from the first character translation code of the variable DIFF. If, for example, DIFF="d3 b7" and I=1, a character string "re" that corresponds to the column "d3" in Table 8 is found and is added to the end of the candidate character string CAN (CAN="abhorre").

At step S1310 the variable I is incremented by one, and program control returns to step S1306, whereat the above described process for translating the character code into a character string is repeated.

When the variable I exceeds the character string length LEN, it means that all the character translation code in the variable DIFF have been replaced with the original character strings and the candidate character string CAN has been recovered. Program control exists the IF loop at branch "No" at decision block S1306, and the recovered candidate character string CAN is returned to the routine requesting source (step S1312). The processing is thereafter terminated.

According to this dictionary search method, at most only ten entry words need be recovered in order to search for the original entry word, and the recovery of the entire entry word index data is not required. Therefore, the decompression process is not required for the search performed in the compressed entry word index, and the search speed is not deteriorated.

E. Appendix

The present invention has been described in detail while referring to specific embodiments. However, it should be obvious to one having ordinary skill in the art that various modifications or revisions of the embodiments are possible within the scope of the present invention.

In these embodiments, an explanation was given for a machine translation apparatus (and an apparatus for compressing entry word index data for a dictionary) that is based on a so-called PC/AT compatible machine ("PC/AT" is a trademark of IBM Corp.) that conforms to the OADG specifications. However, the present invention can be applied in the same way by using another type of apparatus (e.g., an apparatus based on the NEC PC 98 series, or on the Macintosh from Apple computer Inc.), a machine that is compatible with either computer, or an apparatus for which the specified application is machine translation.

In addition, in these embodiments entry word index data for a dictionary are compressed using the compression methods that utilize the n-gram statistical analysis. It should be here noted that the compression methods of the present invention can also be used effectively for compressing another object (e.g., a common text sentence).

That is, although the present invention has been disclosed by using an example, it should not be limited to that example. To fully understand the subject of the present invention, the claims should be referred to.

Advantages of the Invention

As is described above, according to the present invention, provided are a method for compressing entry word index data for a dictionary to be used for machine translation; compressed entry word index data for a dictionary; and a method for searching for a word using the compressed entry word index data.

Further, according to the present invention, provided are a compression method that enables a search for compressed data to be performed without a decompression process being required; entry word index data for a dictionary to be generated by such a compression method; and a method for searching for a word using the compressed entry word index.

What is claimed is:

1. A compression method comprising the steps of:
    (a) extracting character strings, constituted by n (n is an integer greater than 1) or more characters that frequently appear in an object to be compressed, which consists of a plurality of words;
    (b) calculating compression contribution values for the individual extracted character strings wherein for calculating the compression contribution value, the compression contribution value is represented by (n−k)× count, which is a product of (n−k), a compression value obtained by replacing a character string S having n characters with a character string having k characters (n>k), and count, representing the frequency at which the character string S of the object to be compressed appears;
    (c) assigning highly ranked character strings having a high compression contribution value to empty columns in a character translation code table; and
    (d) substituting for a corresponding character translation code the character strings that are registered in the character translation code table.

2. The compression method according to claim 1, wherein the object to be compressed is the entry word index data in a dictionary used for machine translation.

3. The compression method according to claim 1, wherein the character translation code table is an ASCII (American Standard Code for Information Interchange) code table that conforms to the specifications prescribed by ANSI (American National Standards Institute).

4. The compression method of claim 1 including storing the character translation code table generated at step (c) on a storage medium.

5. A method for compressing entry word index data for a dictionary that is used in a machines translation system comprising the steps of:
    (a) extracting character strings constituted by n (n is an integer greater than 1) or more characters that frequently appear in the entry word index data;
    (b) calculating compression contribution values for the individual extracted character strings wherein for calculating the compression contribution value, the compression contribution value is represented by (n−k)× count, which is a product of (n−k), a compression value obtained by replacing a character string S having n characters with a character string having k characters (n>k), and count, representing the frequency at which the character string S in the entry word index data appears;
    (c) assigning highly ranked character strings having a high compression contribution value to empty columns in a character translation code table; and
    (d) substituting for a corresponding character translation code the character strings, in the entry word index data, that are registered in the character translation code table.

6. The compression method according to claim 5, wherein the character translation code table is an ASCII (American Standard Code for Information Interchange) code table that conforms to the specifications prescribed by ANSI (American National Standards Institute).

7. A method for compressing entry word index data, for a dictionary used in a machine translation system, comprising the steps of:
    (a) translating original entry word index data into first entry word index data in which individual entry word character strings are represented by a difference from an entry word character string immediately above;
    (b) selecting, at step (a), an entry word character string that has a large difference from an entry word character string immediately above, as a reference entry word character string that is to be described, unchanged, into the first entry word index data;
    (c) extracting character strings constituted by n (n is an integer greater than 1) or more characters that frequently appear in the first entry word index data;
    (d) calculating compression contribution values for the individual extracted character strings wherein for calculating the compression contribution value, the compression contribution value is represented by (n−k)× count, which is a product of (n−k), a compression value obtained by replacing a character string S having n characters with a character string having k characters (n>k), and count, representing the frequency at which the character string S in the entry word index data appears;
    (e) assigning highly ranked character strings having a high compression contribution value to empty columns in a character translation code table; and
    (f) replacing, with corresponding character translation codes, character strings in the first entry word index data that are registered in the character translation code table and generating second entry word index data.

8. The compression method according to claim 7, wherein the character translation code table is an ASCII (American Standard Code for Information Interchange) code table that conforms to the specifications prescribed by ANSI (American National Standards Institute).

9. A machine translation system for employing the processing capabilities of a computer system to translate text in a first language into text in a second language, comprising:
   a dictionary, including a main body in which are described translation data concerning entry words and an entry word index data compressed using the compression method comprising the steps of:
   (i) extracting character strings constituted by n (n is an integer greater than 1) or more characters that frequently appear in the entry word index data;
   (ii) calculating compression contribution values for the individual extracted character strings wherein for calculating the compression contribution value, the compression contribution value is represented by (n−k)×count, which is a product of (n−k), a compression value obtained by replacing a character string S having n characters with a character string having k characters (n>k), and count, representing the frequency at which the character string S in the entry word index data appears;
   (iii) assigning highly ranked character strings having a high compression contribution value to empty columns in a character translation code table; and
   (iv) substituting for a corresponding character translation code the character strings, in the entry word index data, that are registered in the character translation code table; and
   a translation engine for referring to the dictionary when translating text in the first language into text in the second language.

10. The machine translation system according to claim 9, wherein, when the translation engine searches through the entry word index data for a word included in text in the first language, first, the translation engine replaces a character string included in a word registered in the character translation code table with a corresponding character translation code, and then performs search of the entry word index.

11. A computer-readable storage medium for physically storing a machine translation program that is operated by a computer system, which includes a processor for performing a software program, a memory for temporarily storing program code and data being progressed, an external storage device, input devices used by a user to enter data and a display for displaying processed data, said machine translation program comprising:
   (a) an entry word index data module compressed using the compression method comprising the steps of:
      (i) extracting character strings constituted by n (n is an integer greater than 1) or more characters that frequently appear in the entry word index data;
      (ii) calculating compression contribution values for the individual extracted character strings wherein for calculating the compression contribution value, the compression contribution value is represented by (n−k)×count, which is a product of (n−k), a compression value obtained by replacing a character string S having n characters with a character string having k characters (n>k), and count, representing the frequency at which the character string S in the entry word index data appears;
      (iii) assigning highly ranked character strings having a high compression contribution value to empty columns in a character translation code table; and
      (iv) substituting for a corresponding character translation code the character strings, in the entry word index data, that are registered in the character translation code table;
   (b) a dictionary main body module for describing translation data concerning individual entry words; and
   (c) a translation engine module for referring to the dictionary constituted by the modules (a) and (b) to translate text in a first language into text in a second language.

12. The computer-readable storage medium according to claim 11, wherein, when the translation engine module searches the entry word index for a word included in the text in the first language, first the translation engine module replaces a character string in the word registered in the character translation code table, with a corresponding character translation code, and then performs search of the entry word index.

* * * * *